United States Patent [19]

Endo et al.

[11] Patent Number: 5,177,583
[45] Date of Patent: Jan. 5, 1993

[54] HETEROJUNCTION BIPOLAR TRANSISTOR

[75] Inventors: Takahiko Endo, Hino; Riichi Katoh, Yokohama, both of Japan

[73] Assignee: Kabushiki Kaisha Toshiba, Kawasaki, Japan

[21] Appl. No.: 639,264

[22] Filed: Jan. 10, 1991

[30] Foreign Application Priority Data

Feb. 20, 1990 [JP] Japan ................ 2-39054
Mar. 28, 1990 [JP] Japan ................ 2-76677
May 31, 1990 [JP] Japan ................ 2-142550
Aug. 31, 1990 [JP] Japan ................ 2-231365

[51] Int. Cl.⁵ ............... H01L 29/161; H01L 29/72
[52] U.S. Cl. ................. 257/190; 257/198; 257/592
[58] Field of Search ................... 357/34, 16

[56] References Cited

U.S. PATENT DOCUMENTS 4,593,305 6/1986 Kurata et al. ................ 357/34

FOREIGN PATENT DOCUMENTS 59-211266 11/1984 Japan.

OTHER PUBLICATIONS

H. Kroemer, "Heterostructure Bipolar Transistors and Integrated Circuits", *Proc. IEEE*, vol. 70, No. 1, Jan. 1982, pp. 13–25.

Aicha Elshabini-Riad et al., "Investigation of Injection Mechanisms for InGaAs/InP Double Heterostructure Bipolar Transistors", *Solid-State Electronics*, vol. 32, No. 10, 1989, pp. 853–860.

O. Nakajima et al., "Emitter-Base Junction Size Effect on Current Gain $H_{fe}$ of AlGaAs/GaAs Heterojunction Bipolar Transistors", *Japanese Journal of Applied Physics*, vol. 24, No. 8, Aug. 1985, pp. L596–L598.

C. S. Kyono et al., "Very High Current Gain InGaAs/InP Heterojunction Bipolar Transistors Grown by Metalorganic Chemical Vapour Deposition", *Electronics Letters*, vol. 27, No. 1, Jan. 3, 1991, pp. 40–41.

H. Fukano et al., "Improving the Characteristics of InAlAs/InGaAs Heterojunction Bipolar Transistors by Employing Thin Base and Collector Layers", *Electronics Letters*, vol. 26, No. 15, Jul. 19, 1990, pp. 1101–1102.

P. Narozny et al., "Si/SiGe Heterojunction Bipolar Transistor With Graded GAP SiGe Base Made by Molecular Beam Epitaxy", *IEDM Technical Digest*, 1988, pp. 562–565.

H.-U. Schreiber et al., "Si/SiGe Heterojunction Bipolar Transistor With Base Doping Highly Exceeding Emitter Doping Concentration", *Electronics Letters*, vol. 25, No. 3, Feb. 2, 1989, pp. 185–186.

C. A. King et al., "Si/Si$_{1-x}$Ge$_x$ Heterojunction Bipolar Transistors Produced by Limited Reaction Processing", *IEEE Electron Device Letters*, vol. 10, No. 2, Feb. 1989, pp. 52–54.

*Primary Examiner*—J. Carroll
*Attorney, Agent, or Firm*—Finnegan, Henderson, Farabow, Garrett and Dunner

[57] ABSTRACT

In a first heterojunction bipolar transistor (HBT) of the present invention, base layers and collector layers are respectively divided into a plurality of layers and one of the base layers provided closer to the collector layer region is set lower in impurity concentration than the other thereof provided closer to an emitter layer, thus solving a problem that thermal histories during epitaxial growth or during processes cause a set impurity distribution to be destroyed due to diffusion and thus a heterojunction is shifted from a p-n junction. Since minority carriers in the base can smoothly flow toward the collector, there can be realized an excellent HBT having a very high current gain and a very high cut-off frequency. In a second HBT of the invention, a base region comprises a first base layer of a low concentration having the same energy band gap as an emitter region and to be changed to a complete depletion layer in a thermally balanced state and a graded second base layer of a high concentration, and the first and second base layers form a heterojunction, thereby realizing an excellent HBT having a high speed performance which can exhibit a sufficient grading effect while preventing deterioration of an emitter-base voltage withstanding characteristic.

17 Claims, 21 Drawing Sheets

FIG.14 *PRIOR ART*

HETEROJUNCTION BIPOLAR TRANSISTOR

BACKGROUND OF THE INVENTION

1. Field of the Invention

The present invention relates to heterojunction bipolar transistors having a double heterostructure and more particularly, to a heterojunction bipolar transistor having an improved base and collector structure and an improved base and emitter structure.

2. Description of the Related Art

A heterojunction bipolar transistor (hereinafter referred to as HBT) having an emitter region made of semiconductor material that is larger in band gap than a base region, has been widely studied as a microwave transistor or a high-speed logical circuit transistor, since the heterojunction transistor is more excellent in high frequency and switching characteristics than a homojunction bipolar transistor.

The HBT using GaAs or AlGaAs as the semiconductor material, in particular, has been increasingly considered to offer a very promising prospect as a superhigh speed device, since the transistor is larger in carrier mobility than a transistor using Si. However, because such compound semiconductor as GaAs or AlGaAs is more expensive and brittler than Si, the HBT using such material has been considered to be rather unsuitable in the current circumstances for its mass production when compared with the transistor using Si.

In order to overcome such circumstances, there have been made attempts to introducing the heterojunction into the Si bipolar transistor to attain its higher performances. And there has been recently reported a so-called silicon-based HBT having a wide gap emitter of $Si_{1-x}C_x$ $(0.0 < x \leq 1.0)$ grown on Si or having a narrow gap base of $Si_{1-x}Ge_x$ $(0.0 < x \leq 1.0$, hereinafter x is assumed to be in the same range) grown on Si, which has been made on an experimental basis. In particular, the latter $Si_{1-x}Ge_x/Si$ HBT, in which a base layer is made of material smaller in band gap than Si and thus its turn-on voltage is small, requires less power consumption than the prior art Si bipolar transistor. In addition, since $Si_{1-x}Ge_x/Si$ HBT uses a base layer made of mixed crystal $Si_{1-x}Ge_x$, a so-called graded base structure wherein an electric field for acceleration of carriers is provided in the base can be employed therefor and thus the transistor can be operated at a speed faster than that of the prior art Si bipolar transistor.

In this way, the $Si_{1-x}Ge_x/Si$ HBT, when compared with the prior art homojunction silicon bipolar transistor, requires less power consumption and produces a higher operational speed, but has a problem which follows, because of its so-called double heterostructure, i.e., having the other heterojunction also in the collector side.

FIG. 18 shows a diagrammatical cross-sectional view of an epitaxial wafer used in a prior art $Si_{1-x}Ge_x/Si$ series HBT. The epitaxial wafer is obtained usually by a molecular beam epitaxy (MBE) technique, a chemical vapor deposition (CVD) technique based on a limited reaction processing (LRP), or the like technique.

The HBT is prepared with use of such a wafer. That is, the wafer is made by sequentially epitaxially growing an $n^+$ type Si layer 21 of 200 nm thickness and having a doping concentration of $1 \times 10^{20}$ cm$^{-3}$ as a collector contact layer, an $n^-$ type Si layer 22 of 500 nm thickness and having a doping concentration of $5 \times 10^{16}$ cm$^{-3}$ as a collector layer, a $p^+$ type $Si_{0.9}Ge_{0.1}$ layer 23 of 50 nm thickness and having a doping concentration of $1 \times 10^{19}$ cm$^{-3}$ as a base layer, an n type Si layer 24 of 150 nm thickness and having a doping concentration of $1 \times 10^{17}$ cm$^{-3}$ as an emitter layer, and an $n^+$ type Si layer 25 of 100 nm thickness and having a doping concentration of $1 \times 10^{20}$ cm$^{-3}$ as an emitter cap layer all formed on a $p^-$ type Si substrate 20. The impurity doping concentrations for the respective epitaxial layers are set to become uniform. The thicknesses of the respective layers and dopant types illustrated in FIG. 18 refer to so-called design values set prior to the execution of the epitaxial growth.

Shown in FIG. 19 an energy band profile within a device when it is assumed that the dopants are activated as carriers in a condition where the thicknesses of the respective layers of a wafer and the impurity distributions are the same as design values. In the drawing, electron energy is expressed as positive. As will be seen from the drawing, an energy band discontinuity at a heterojunction interface between the $Si_{0.9}Ge_{0.1}$ and Si layers is about 0.1 eV, 80% of which, i.e., 0.08 eV appears as a band discontinuity on the side of a valence band and the remainder, i.e., 0.02 eV, that is very small, appears as a band discontinuity on the side of a conduction band. It is known that such tendency is not changed and the band discontinuity value of the conduction band side is not changed and substantially constant even when a content of Ge to Si is increased to a fairly high level. Accordingly, in the case of an npn type bipolar transistor, the band discontinuity of the conduction band side is very small even when the heterojunction interface between the $Si_{0.9}Ge_{0.1}$ and Si layers is abruptly changed, so that electrons can smoothly flow from an emitter to a collector while holes can be effectively trapped within a base layer by means of a potential barrier caused by the large band discontinuity of the valence band side. Thus, it will be appreciated that, so long as at least this material series is employed, the use of the abrupter heterojunction enables the transistor to have a higher performance.

In the course of actually fabricating a transistor with use of the aforementioned epitaxial wafer, the wafer experiences various thermal histories including epitaxial growth itself. That is, heating the wafer to a high temperature causes a doping profile so far set to be inevitably changed due to thermal diffusion. In particular, the base layer is as thin as at most 100 nm and very high in doping concentration, the thermal diffusion of the dopant within the base layer becomes a problem.

FIG. 20 shows an impurity profile in a wafer of a resultant transistor completed after the wafer of FIG. 18 experiences various thermal histories, in which a design impurity profile is represented by solid lines and the final impurity profile is by broken lines and two-dot chain lines. It will be seen from FIG. 20 that, since the dopant of the base layer diffuses into the emitter and collector sides and p type and n type dopants are effectively changed as compensated for, the heterojunction and the p-n junction are shifted from their set positions.

Shown in FIG. 21 is a model form of energy band profile corresponding to the effective doping profile of the final transistor shown in FIG. 20. In FIG. 21, electron energy is set to be positive as in FIG. 19. It will be seen from the drawing that, since the collector is usually set to be lower in impurity concentration than the emitter for the purpose of making small the capacitance of the base/collector junction, the effective impurity type in the vicinity of the base/collector junction in the collector is p type due to the diffusion of the p type dopant from the base layer thereto, which results in that the heterojunction is formed in the p type region and a potential barrier to electrons is formed in the conduction band.

For this reason, so long as such an epitaxial wafer film structure as in the prior art is employed, not only it is impossible to obtain a previously set doping profile for the completed final transistor but also the potential barrier formed on the conduction band side prevents the flow of electrons from the base to the collector. This results in that the electron transportation efficiency is remarkably reduced and thus the current amplification factor and the operational speed are reduced, which becomes a serious problem in the transistor fabrication. This problem is not limited to the aforementioned $Si_{1-x}Ge_x/Si$ HBT and holds true even for an HBT of an npn type and of a double heterostructure using such semiconductor material having the band discontinuity of the heterojunction appearing mainly on the valence band side as InP/GaInAsP compound semiconductor material and when employing such an epitaxial wafer film structure as in the prior art. Further, even when an HBT of a pnp type and of a double heterostructure is to be prepared using such materials having the band discontinuity appearing mainly on the conduction band side as AlGaAs and GaAs, this problem becomes serious.

In this way, the HBT of the double heterostructure using such semiconductor material that the band discontinuity of the heterojunction appears mainly on the valence band side has had a problem that, since the heterojunction and the p-n junction, in particular, at the base/collector junction are shifted by the thermal histories, it is difficult to realize a high current gain and a high speed operation inherent in an HBT.

In an HBT, it is common practice to make thin a base region for the purpose of obtaining a high speed operation. However, making thin the base region, at the same time, causes a base sheet resistance to be increased. To avoid this, it is desirable to set the base region at a high impurity concentration.

Meanwhile, it has been so far considered as taught, for example, in a paper entitled "Heterostructure Bipolar Transistor and Integrated Circuits", H. Kroemer, in the Proc. IEEE, Vol. 70, No. 1, pp. 13-25, January 1982, that an emitter region is set preferably at a low impurity concentration because a capacitance $C_E$ of an emitter/base junction is set small in order to shorten an emitter charging time. However, it has been found through simulation that the setting of the emitter region at a high impurity concentration enables the operation of the transistor up to its high current density zone to realize a high speed operation (for example, refer to a paper entitled "Characteristic Analysis of $Si_{1-x}Ge_x/Si$-HBT based on DC one-dimensional Model", Endo, et al., in the Proceeding of the Fiftieth Meeting of The Japan Society of Applied Physics, 28p-A-16, 1989). According to this paper, as the impurity concentration of the emitter increases, transconductance $g_m$ increases beyond the corresponding amount of capacitance increase of the emitter/base junction and thus the emitter charging time decreases. That is, we can consider that an HBT having a high concentration emitter can be operated faster than an HBT having a low concentration.

As has been explained above, since the base impurity concentration of the HBT is high by nature, the increased emitter impurity concentration causes the thickness of the depletion layer region at the heterojunction interface to be decreased, so that an electric field created at the p-n junction becomes extremely strong and thus the voltage withstanding characteristic becomes deteriorated. This is unfavorable from the viewpoint of the actual device applications. For the purpose of overcoming it, there has been proposed an HBT structure wherein a base region is made up of two base layers, a first one of which is provided on the side of an emitter and is set to have such a thickness $W_{B1}$ and a low impurity concentration $N_{B1}$ that satisfy the following relationship (1), whereby the base region becomes a complete depletion layer region in a thermally balanced state and thus the high concentration emitter can be realized without causing deterioration of a voltage withstanding characteristic (refer to Japanese Patent Disclosure (Kokai) No. 59-211266).

$$N_{B1}W_{B1}^2 \leq 2\epsilon_B\epsilon_0 V_{bi}/q \qquad (1)$$

where, q is the unit quantity of electric charge $(1.60 \times 10^{-19} C.)$, $\epsilon_0$ is dielectric constant in vacuum $(8.86 \times 10^{-14} F./cm)$, $\epsilon_B$ is the relative dielectric constant of the first base layer, and $V_{bi}$ is a built-in potential for a p-n junction made up of the emitter region and the first base layer.

Meanwhile, it is known that, when the base region is made of compound semiconductor material such as $Si_{1-x}Ge_x$ that allows change of an energy band gap by changing a composition ratio x of the compound semiconductor, the employment of a graded base structure is high effective for realizing a transistor having a high operational speed. To this end, in the transistor of the prior art structure, grading is provided throughout the entire base region to maximize the aforementioned effect.

Now consider the aforementioned 2-layer base structure is employed for the prior art graded base structure subjected to the grading therethroughout. In this case, the grading starts from an end of the emitter side of the first base layer having a low impurity concentration. However, since the first base layer becomes a complete depletion layer in a thermally balanced state under such a condition as to satisfy the relationship (1), the grading effect at that part disappears, which is unpreferable from the viewpoint of realizing a high speed transistor.

Meanwhile, in the case of the $Si_{1-x}Ge_x/Si$ HBT wherein the collector (or emitter) region is different from the base region in the lattice constant of the semiconductor material, it is impossible to set the thickness of the base region at a value larger than its critical film thickness. The term "critical film thickness" as used herein means the maximum thickness of the thin film up to which material different in lattice constant from the substrate can be grown on a substrate by an existing crystal growth technique without causing any lattice defects or shift at the heterojunction interface. When grading is applied throughout the entire base region as in the aforementioned base of the prior structure, since the first base layer of the base region in which no grading effect appears and the second base layer in which the grading effect appears are both made of the same semiconductor material, the total thickness of the base region becomes larger by an amount corresponding to the provision of the first base layer and thus the base is subject more largely to the restriction of the aforementioned critical film thickness.

That is, there has existed a problem that the feature of the graded base structure cannot be effectively exhibited by means of a mere combination of the prior art 2-layer base structure and the graded base structure and the combination structure tends to be easily limited by the crystal growth technique.

In this way, it has been difficult to effectively exhibit the feature of the graded base structure and for the crystal growth to less limit the combination structure and to realize an HBT having excellent voltage withstanding and high-speed characteristics, by means of the mere combination of the prior art 2-layer base structure and the graded base structure.

Further, when the first and second base layers are made of the same semiconductor material, since the thickness of the base region becomes larger by an amount corresponding to the provision of the first base layer, the 2-layer base structure will be more strongly subject to the aforementioned the limitation critical film thickness.

The limitation can be lightened by making small a difference in lattice constant between the semiconductor materials of the collector or emitter region and the base region. However, the changing of the composition ratio of the base material to make small the difference in lattice constant between the base and collector or emitter has involved such a problem that, since this is usually equivalent to making small a difference in energy band gap between the both, the feature of the heterojunction cannot be sufficiently exhibited.

In this way, in the case of the HBT of the prior art 2-layer structure of the emitter and base, when the semiconductor material of the emitter or collector is different in lattice constant from that of part of the base region, the structure is limited by the critical film thickness and thus it is difficult to realize an excellent HBT having a high speed operational performance.

In view of the above circumstances, it is an object of the present invention to provide a layer structure in an epitaxial wafer for use in fabricating an HBT of an npn type which has a base/collector junction of an abrupt heterojunction and uses a semiconductor material causing band discontinuity of the heterojunction to appear mainly on the side of a valence band, which layer structure can prevent formation of a potential barrier to electrons in the vicinity of a base/collector junction of a conduction band to thereby obtain a smooth conduction band profile allowing quick flow of electrons.

Another object of the present invention is to provide a layer structure in an epitaxial wafer for use in fabricating an HBT of a pnp type which has a base/collector junction of an abrupt heterojunction and uses a semiconductor material causing band discontinuity of the heterojunction to appear mainly on the side of a conduction band, which layer structure can prevent formation of a potential barrier to positive holes in the vicinity of a base/collector junction of conduction band to thereby obtain a smooth valence band profile allowing quick flow of positive holes.

A further object of the present invention is to realize an HBT having excellent voltage withstanding and high operational speed characteristics, which can sufficiently exhibit the feature of a graded base structure and can lighten the restrictions of a crystal growth technique.

Yet a further object of the invention is to realize an HBT of a 2-layer structure of an emitter and a base having a high operational speed characteristic, which can lighten any restriction of a critical film thickness caused by the limitations of a crystal growth technique.

SUMMARY OF THE INVENTION

In accordance with one of aspects of the present invention, one of the above objects can be attained by a first HBT of a double heterostructure in which an emitter layer and a collector layer are made of a material that is larger in energy band gap than a base layer and each of the base and collector layers is divided into two sub-layers. The first HBT is featured in that relationships which follow are satisfied:

$$W_2 \geqq W_3 \text{ and } N_2 > N_3 \text{ and } N_4 \geqq N_5$$

or $$W_2 \geqq W_3 \text{ and } N_2 > N_3 \text{ and } N_4 \geqq N_5$$

where, one of the sublayers of the base layer closer to the emitter layer has an impurity doping concentration $N_2$ and a thickness $W_2$ while the other of the sublayers of the base layer closer to the collector layer has an impurity doping concentration $N_3$ and a thickness $W_3$, and one of the sublayers of the collector layer closer to the base layer has an impurity doping concentration $N_4$ while the other of the sublayers of the collector layer closer to the subcollector layer has an impurity doping concentration $N_5$.

In other words, the first HBT of the present invention is featured in that one of the sublayers of the base layer on the side of the collector layer is set lower in impurity concentration than the other on the side of the emitter layer, the base sublayer having the lower impurity concentration is set smaller in thickness than the other having the higher impurity concentration, while one of the sublayers of the collector layer on the side of the base layer is set higher in impurity concentration than the other on the side of the collector sublayer. As a result, even when the wafer is subjected to thermal histories during processes in fabricating the transistor and dopants of the higher concentration base sublayer are thermally diffused toward the collector layer side, so long as the diffusion stops in the lower concentration base sublayer, any shift between a p-n junction and a heterojunction will not occur. In addition, even when dopants of the higher concentration base sublayer are thermally diffused into the collector layer, the collector layer of the relatively high concentration compensates for the dopant type, so that the formation of a potential barrier to minority carriers in the base layer can be prevented and thus carriers entering from the emitter layer into the base layer can move quickly toward the collector layer.

In this way, in the first HBT of the present invention, since each of the base and collector layers is divided into a plurality of sublayers and one of the sublayers of the base layer disposed on the side of the collector layer is set lower in impurity concentration than the other disposed on the side of the emitter layer, even when the dopants of the higher-concentration base sublayer are diffused toward the collector layer during the fabricating processes of the transistor, a positional shift between the heterojunction and p-n junction can be prevented since the diffusion of the dopants of the higher-concentration base sublayer stops in the lower-impurity-concentration sublayer. Further, one of the sublayers of the collector layer disposed on the side of the base layer is set higher in impurity concentration than the other disposed on the side of the collector sublayer, even when the dopants of the higher-concentration base sublayer are diffused toward the collector layer and reach the collector region, the dopants are compensated for by the higher-concentration collector sublayer, the type of the dopants of the collector region remains the same or is changed to an i layer, thus ensuring the elimination of a possibility that a positional shift between the heterojunction and p-n junction may take place. Accordingly, when the layer structure according to the present invention is employed, a potential barrier to minority carriers can be prevented from being formed in the base layer so that carriers entering from the emitter layer into the base layer can move quickly into the collector layer, whereby there can be provided an HBT which has a very high current gain and a very high cut-off frequency $f_T$.

In accordance with another aspect of the present invention, there is provided a second HBT which is featured in that, in the first HBT, a relationship which follows is satisfied:

$$W_4 \leq \left[ \frac{2\epsilon_i V_{bi}}{q N_4 (1 - \epsilon_i N_4 / \epsilon_3 N_3)} \right]$$

where, one of the sublayers of the base layer disposed closer to the collector layer is set to have an impurity doping concentration $N_3$ and a dielectric constant $\epsilon_3$ and one of the sublayers of the collector layer disposed closer to the base layer is set to have an impurity doping concentration $N_4$ and a dielectric constant $\epsilon_4$ and a thickness $W_4$, and a built-in voltage at the base/collector junction is $V_{bi}$.

That is, the second HBT of the present invention is featured in that, in the first HBT, the thicknesses and doping concentrations of the respective layers are set so that the higher concentration sublayer of the collector layer provided closer to the base layer is depleted in a thermally balanced state. As a result, dopants are not diffused from the base layer to the higher concentration collector sublayer so that, even when the impurity concentration cannot be effectively reduced, since the thicknesses and doping concentrations of the layers are set so as to previously deplete the higher concentration collector sublayer (otherwise, the capacitance of the base/collector junction becomes large due to the high-concentration p-n junction), the capacitance of the base/collector junction can be suppressed not to be very large.

In this way, the second HBT of the present invention is featured in that, in the first HBT, the thicknesses and doping concentrations of the base and collector layers contacted with a hetero-interface between the base and collector are set so as to deplete the higher concentration sublayer of the collector layer provided closer to the base layer. With such a structure, dopants are not diffused from the base layer to the higher-concentration collector sublayer so that, even when the impurity concentration cannot be effectively reduced, since the thicknesses and doping concentrations of the layers are set so as to previously deplete the higher concentration collector sublayer (otherwise, the capacitance of the base/collector junction becomes large due to the high-concentration p-n junction), the capacitance of the base/collector junction can be suppressed not to be very large. Thus, there can be provided an HBT which has, in addition to the effects obtained by the first HBT, a very high maximum oscillation frequency $f_{MAX}$ and a very small propagation delay time $t_{pd}$.

The HBT of the present invention comprises the base region of the first and second base sublayers, first one of which is disposed closer to the emitter and has an energy band gap set equal to that of the emitter region, a small thickness and an impurity concentration set much lower than the emitter region to be changed to a complete depletion layer in the thermally balanced state, second one of which has a high impurity concentration and a graded structure arranged so as to form a heterojunction together with the first base sublayer.

With the aforementioned structure, since the first base sublayer of the low concentration is provided between the emitter region and the original base layer of the prior art structure to be completely depleted in the thermally balanced state, an electric field generated at the pn junction between the emitter and base is weaker than that generated at the pn junction of the high impurity concentration, whereby the voltage withstanding characteristic is improved.

Further, since the first base sublayer contacted with the emitter region has a low concentration, the emitter concentration can be increased so that the transistor can be operated in the higher current density zone and the emitter charging time can be reduced.

Meanwhile, when grading is provided throughout the entire base region as in the HBT of the prior art structure, the first base sublayer is completely depleted and therefore the grading effect is lost.

With the present structure, however, since the grading is previously applied only to the second base sublayer, there exists substantially no region in which the grading effect is lost by the complete depletion of the first base sublayer.

Thus, grading becomes more effective when provided to only the second base sublayer rather than provided to both of the first and second base sublayers.

In addition, since the semiconductor material of the first base sublayer is different from that of the second one, the restriction of the critical film thickness can be lightened and the effective base layer can be made thick by an amount corresponding to the provision of the first base sublayer.

Furthermore, when the band gap differences at both ends of the region applied with the grading are set equal to each other, the application of the grading only to the second base sublayer can provide carrier acceleration electric field larger than the application of the grading throughout the entire base region.

With the present structure, since the band gap of the first base sublayer is equal to that of the emitter region, the band discontinuity of a valence band corresponding to the band gap difference at the heterojunction interface takes place at the junction interface between the first and second base sublayers.

For this reason, holes in the second base sublayer becomes more difficult to enter into the first base sublayer which forms a depletion layer region where recombination of electron and hole tends to easily occur, than the case where the band gap of the first base sublayer is smaller than that of the emitter region, whereby a recombination current can be suppressed. Similarly, the number of holes injected back into the emitter region becomes small and conductivity modulation becomes difficult to occur. In this way, when it is desired to fabricate a device having a higher performance and a higher operational speed, the case where the band gap of the first base sublayer is set equal to that of the emitter region is more suitable than the case where the band gap of the first base sublayer is set smaller than the band gap of the emitter region.

Further, in the HBT of the present invention, the emitter region comprises a first emitter layer and a second emitter layer made of the same material as the first emitter layer and having a concentration lower than that of the first emitter layer, the base region comprises a first base layer made of preferably the same material as the first and second emitter layers and equal in band gap thereto and a second base layer which forms a heterojunction together with the first base layer and has a band gap narrower than the emitter region and the first base layer.

Desirably, the first base layer is formed to be lower in impurity concentration than the second base layer.

Further, it is preferable that the composition ratio of compound semiconductor material of the second base layer is varied so that the band gap becomes gradually narrower continuously or stepwise from the side of the first base layer to the side of the collector.

With the above arrangement, since the semiconductor material of the first base layer is set equal in band gap to that of the emitter region, and desirably made of the same material thereas, holes within the second base layer in the case where the band discontinuity of a valence band corresponds to the band gap differences at the heterojunction interface between the first and second base layers, becomes more difficult to enter into the second emitter layer and the first base layer where recombination of electron and hole tends to easily occur tend to easily recombine with electrons, than the case where the first base layer and the emitter layer form the band discontinuity, which results in that the recombination current can be suppressed.

Similarly, the number of holes injected back into the first emitter layer becomes small and conductivity modulation becomes difficult to occur.

Further, when the semiconductor material of the first base layer is set to be the same as that of the emitter region, the restriction of the critical film thickness on the entire base region can be lightened, the effective base layer can be made thick by an amount corresponding to the provision of the first base layer, and the base sheet resistance can be made small.

Moreover, the first base layer, which can completely eliminate the subjection of the restriction of critical film thickness, can be highly easily fabricated.

In this way, the first base layer and the emitter region are respectively made of the materials equal in band gap to each other, a device having a high speed performance can be fabricated when compared with the prior art structure having the base layer set smaller in band gap than the emitter region.

Now consider the case where the first base layer is set lower in impurity concentration than the second base layer.

Since the depletion layer region in the vicinity of the emitter/base junction is extended toward the base by an amount corresponding to the difference in impurity concentration between the first and second base layers, the emitter concentration can be increased and the emitter charging time can be shortened.

Further, since the first base layer of the low concentration to be changed to a depletion layer is provided between the emitter and the second base layer corresponding to the original base layer, an electric field generated at the pn junction between the emitter and base can be weaker than that generated at the pn junction of the high impurity concentration, thus improving the voltage withstanding characteristic.

In addition, when the second base layer is of a graded structure, the carrier running time through the base can be shortened due to the acceleration electric field. In particular, in the case where the impurity concentration of the first base layer is set lower than that of the second base layer, since grading is previously applied only to the second base layer, there exists substantially no region in which the change of the first base layer to the depletion layer region causes the grading effect to be lost.

Meanwhile, when grading is provided to the entire base region as in the HBT of the prior art structure, since the first base layer is changed to the depletion layer region, this causes the disappearance of the grading effect.

Therefore, the application of the grading to only the second base layer can be more effective than the application of the grading to the entire base layer.

Further, when the band gap differences at the both ends of the graded region are set equal to each other, the application of grading only to the second base layer can produce a carrier acceleration electric field larger than the application of grading to the entire base region.

DESCRIPTION OF THE PREFERRED EMBODIMENTS

The present invention will be detailed in connection with its embodiments.

Embodiment 1

Figure 1:
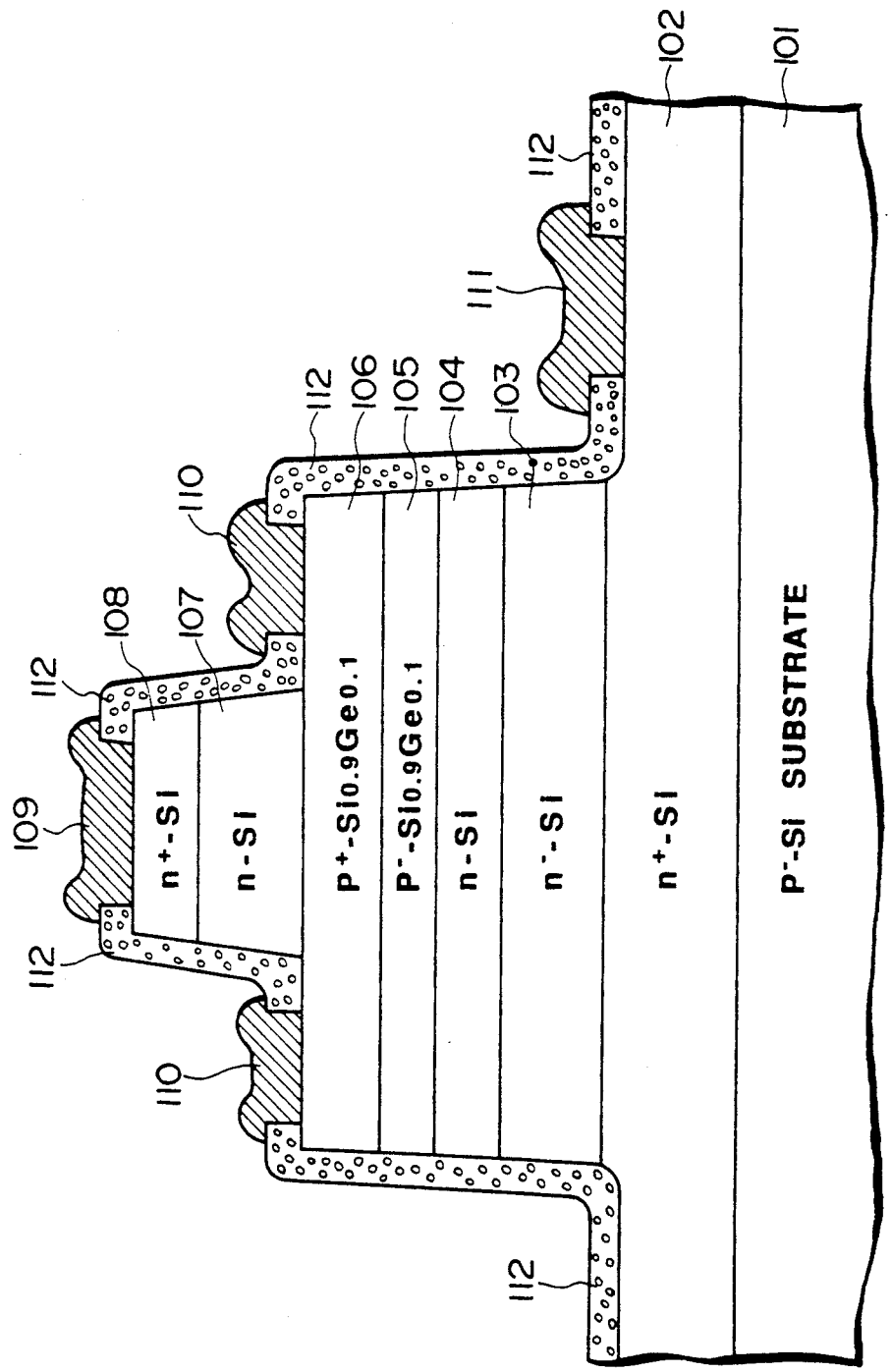
FIG. 1 is a cross-sectional view of a heterojunction bipolar transistor (HBT) in accordance with a first embodiment of the present invention.

Referring first to FIG. 1, there is shown a cross-sectional view of an HBT using a $Si_{1-x}Ge_x$ material in accordance with a first embodiment of the present invention, in which the types of dopants are ones set prior to epitaxial growth. Prior to the fabrication of this transistor, it is first necessary to sequentially epitaxially grow semiconductor layers of a p type Si substrate 101. The epitaxial growth is carried out by a molecular beam epitaxy (MBE) technique, a chemical vapor deposition technique based on a limited reaction processing (LRP) or the like techniques.

Explanation will next be made as to the detailed fabrication conditions according to the sequential fabrication steps. First epitaxially grown on the p- type Si substrate 101 is an Sb-doped Si layer 102 of an n- type having an impurity concentration of $1 \times 10^{20} cm^{-3}$ and a thickness of 200 nm as a collector contact layer.

Then epitaxially grown on the layer 102 are an Sb-doped Si layer 103 of an n- type having an impurity concentration of $5 \times 10^{16} cm^{-3}$ and a thickness of 450 nm as a first collector layer and subsequently an Sb-doped Si layer 104 of an n type having an impurity concentration of $4 \times 10^{17} cm^{-3}$ and a thickness of 50 nm as a second collector layer sequentially. Next epitaxially grown on the layer 104 are a B-doped $Si_{0.9}Ge_{0.1}$ layer 105 of a p type having an impurity concentration of $5 \times 10^{17} cm^{-3}$ and a thickness of 3 nm as a first base layer and then a B-doped $Si_{0.9}Ge_{0.1}$ layer 106 of a p- type having an impurity concentration of $1 \times 10^{19} cm^{-3}$ and a thickness of 47 nm as a second base layer sequentially.

Epitaxially grown on the layer 106 are an Sb-doped Si layer 107 of an n type having an impurity concentration of $5 \times 10^{17} cm^{-3}$ and a thickness of 150 nm as an emitter layer and subsequently an Sb-doped Si layer 108 of an n- type having an impurity concentration of $1 \times 10^{20} cm^{-3}$ and a thickness of 100 nm as a emitter cap layer sequentially.

A wafer having the layers thus epitaxially grown is subjected to an etching process until a base electrode formation region reaches the p- type Si layer 106 and at the same time, a collector electrode formation region is subjected to an etching process until it reaches the n- type Si layer 102 as the collector contact layer. After that, the resultant wafer is subjected to a CVD process to deposit a silicon oxide film 112 on the entire surface of the wafer and then to a selective etching process to remove those parts of the silicon oxide film corresponding to the contact areas with an emitter, a base and a collector. Finally, an emitter electrode 109, a base electrode 110 and a collector electrode 111 all as aluminum layers are formed, at which stage a transistor is completed.

Figure 2:
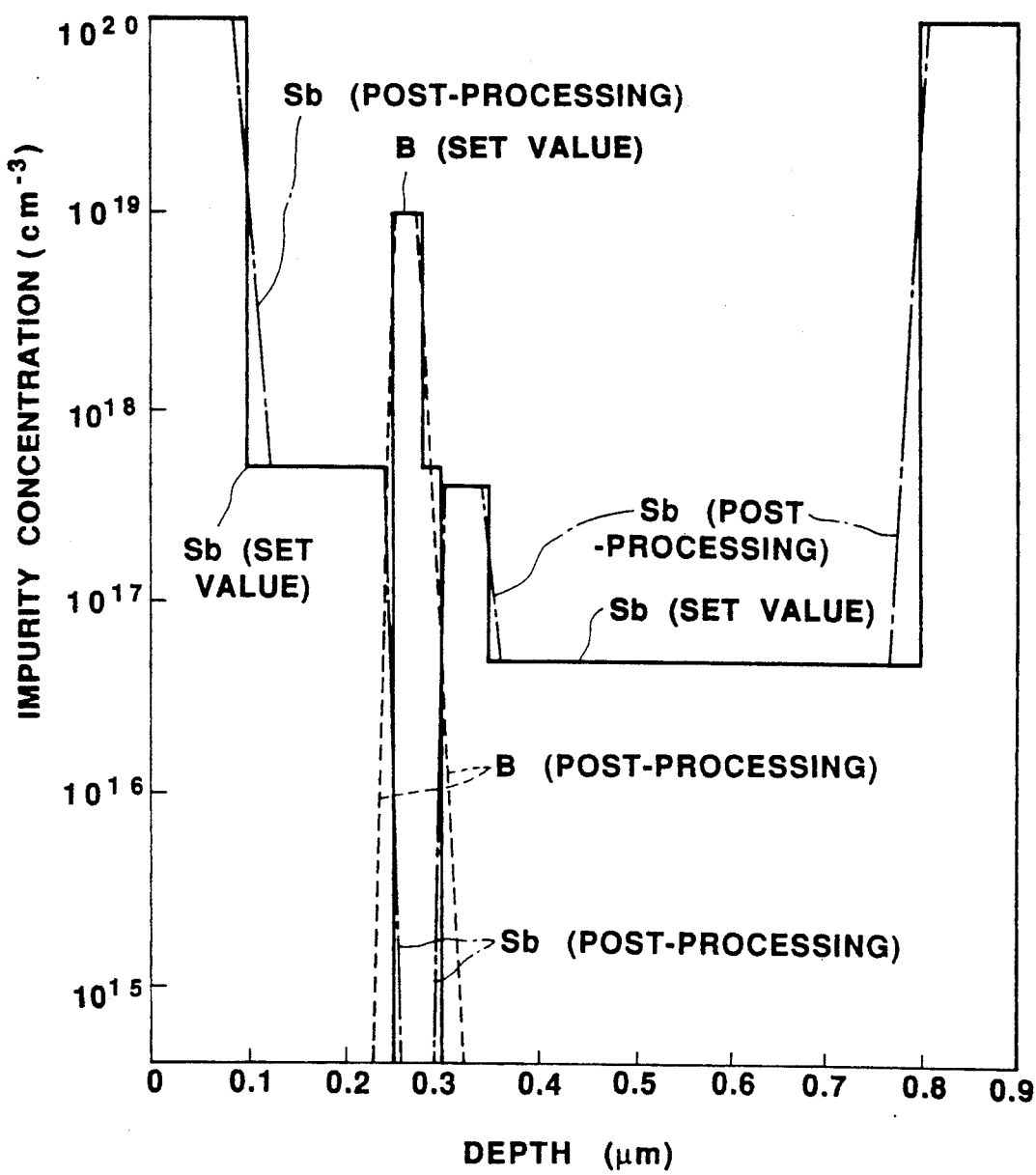
FIG. 2 shows a design impurity profile of the HBT of the first embodiment of the present invention and an impurity profile after subjected to processes.

FIG. 2 shows impurity profiles for a transistor having the same structure as the thus-fabricated HBT in its depth direction, in which a design impurity profile set according to design values is denoted by a solid line, an Sb impurity profile varied under the influence of thermal histories of the processes is denoted by a chain-dotted line, and a B impurity profile varied under the influence of the thermal histories of the processes is denoted by a broken line. The impurities of the high-concentration base layer are diffused into the collector region. However, the provision of the low-concentration base layer causes the concentration of impurities diffused into the collector to be reduced and that part of the collector layer of a relatively high concentration close to the base causes the diffused impurities to be compensated for and thus the type of dopants of the collector becomes n or i.

Figure 3:
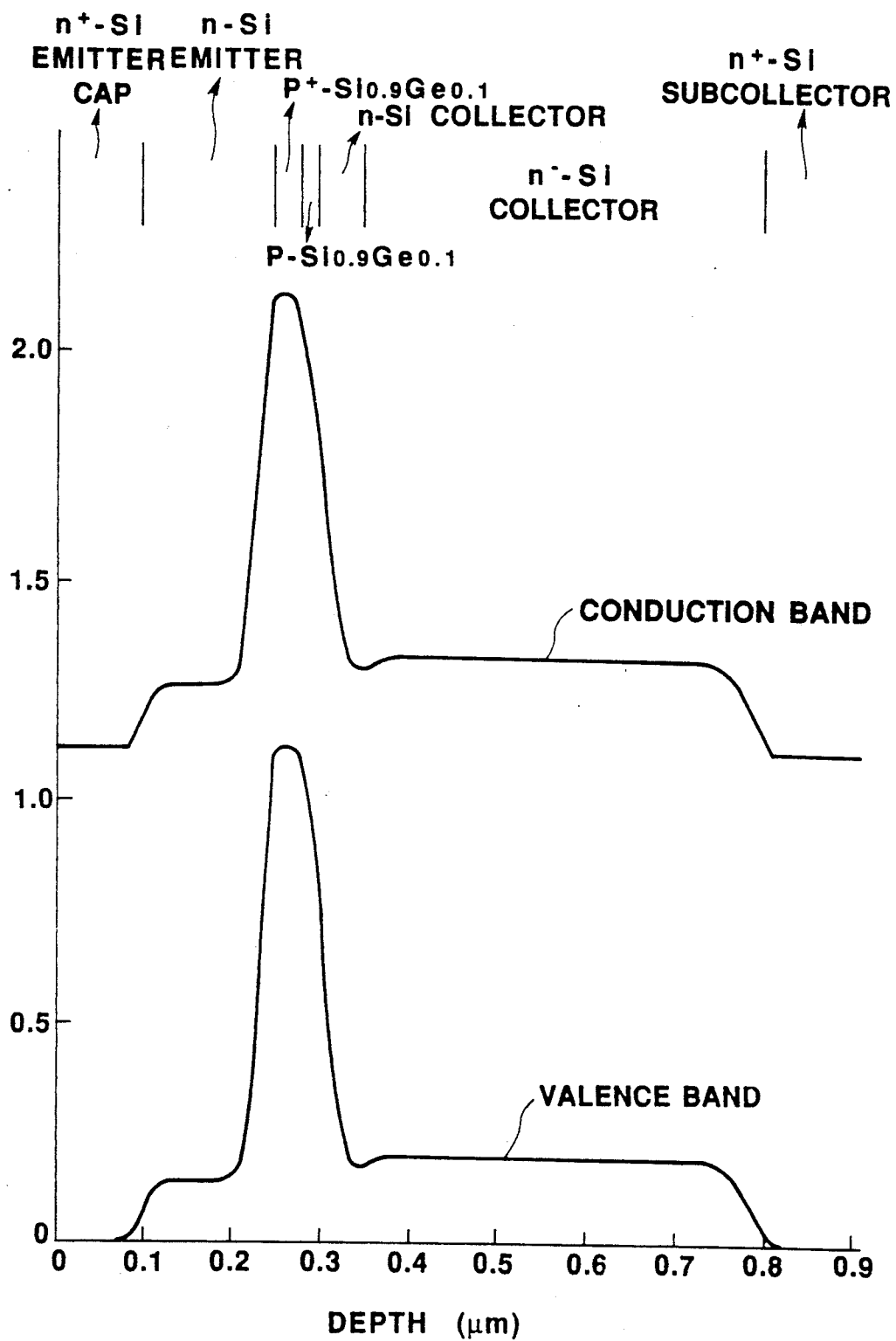
FIG. 3 shows energy band profiles of the HBT of the first embodiment in a thermally balanced state obtained through simulation.

Shown in FIG. 3 are energy band profiles for the transistor in its thermally balanced state obtained through simulation, which profiles correspond to the impurity profiles of FIG. 2. It will be appreciated from the drawing that, unlike the prior art (FIG. 15), a potential barrier is not formed in the base layer on its collector layer side and thus electrons in the base can smoothly be moved toward the collector.

Figure 4:
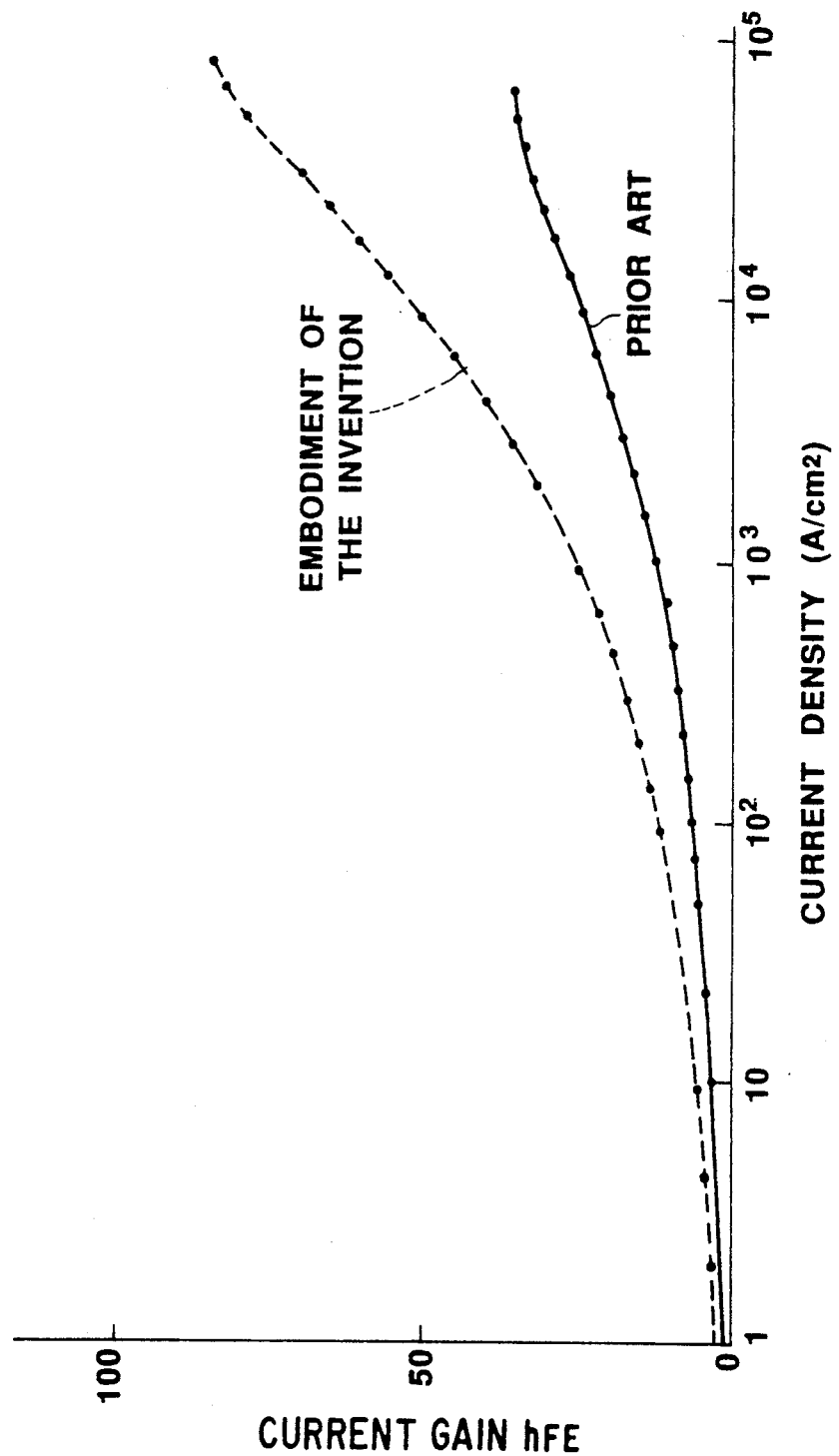
FIG. 4 is a graph showing relationships between current gain and current density obtained through simulation with respect to the HBT of the first embodiment of the present invention and a prior art HBT.
Figure 14:
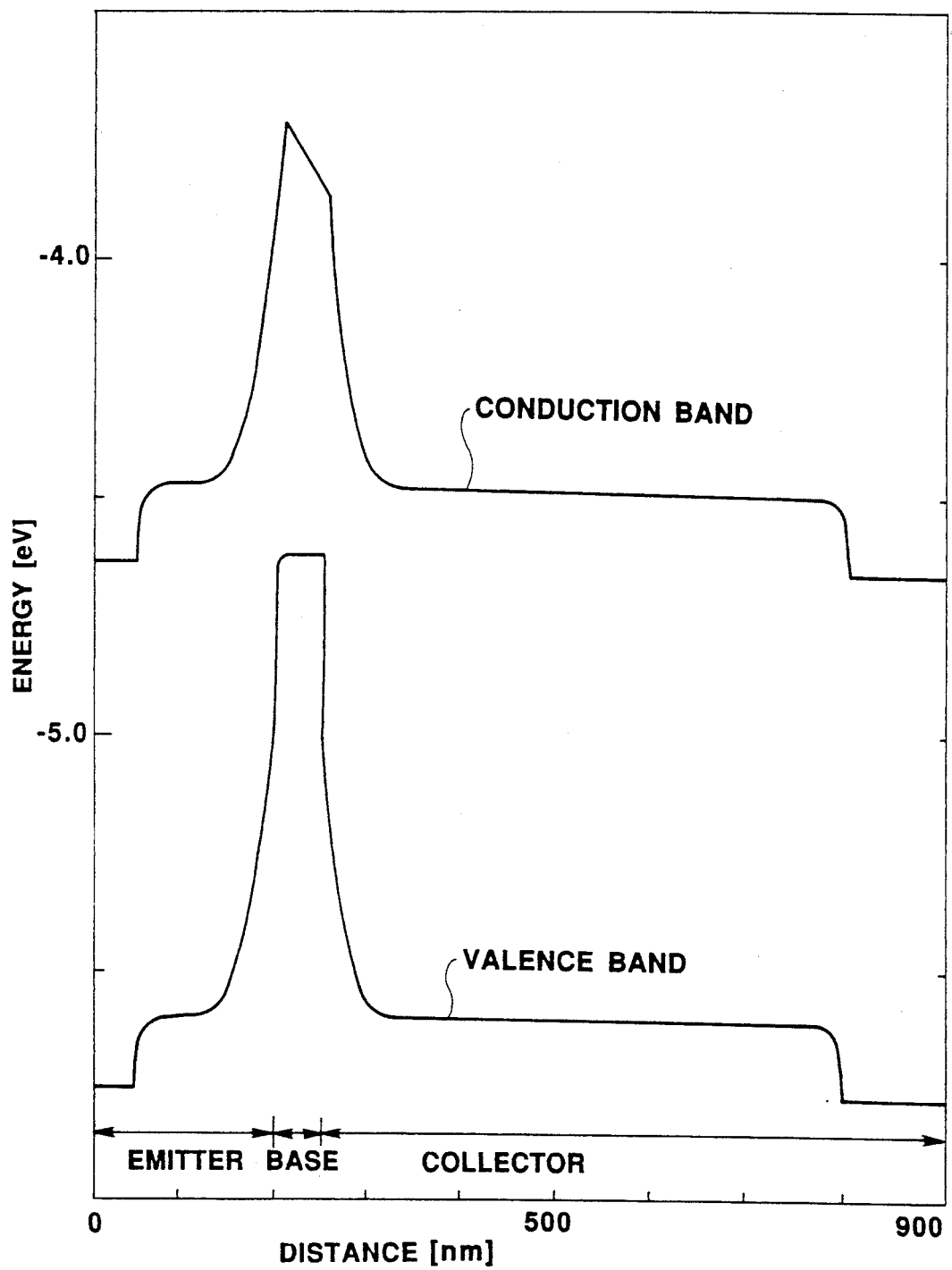
FIG. 14 shows band profiles of a prior art HBT.

FIG. 4 is a graph showing relationships between current gain and current density obtained through simulation with respect to the HBT of the present embodiment having such impurity profiles as shown in FIG. 3 and the prior art HBT having such impurity profiles as shown in FIG. 14 for their comparison. It will be seen from the drawing that the HBT of the present embodiment exhibits a current gain higher than that of the prior art one in all the current density zone.

Figure 5:
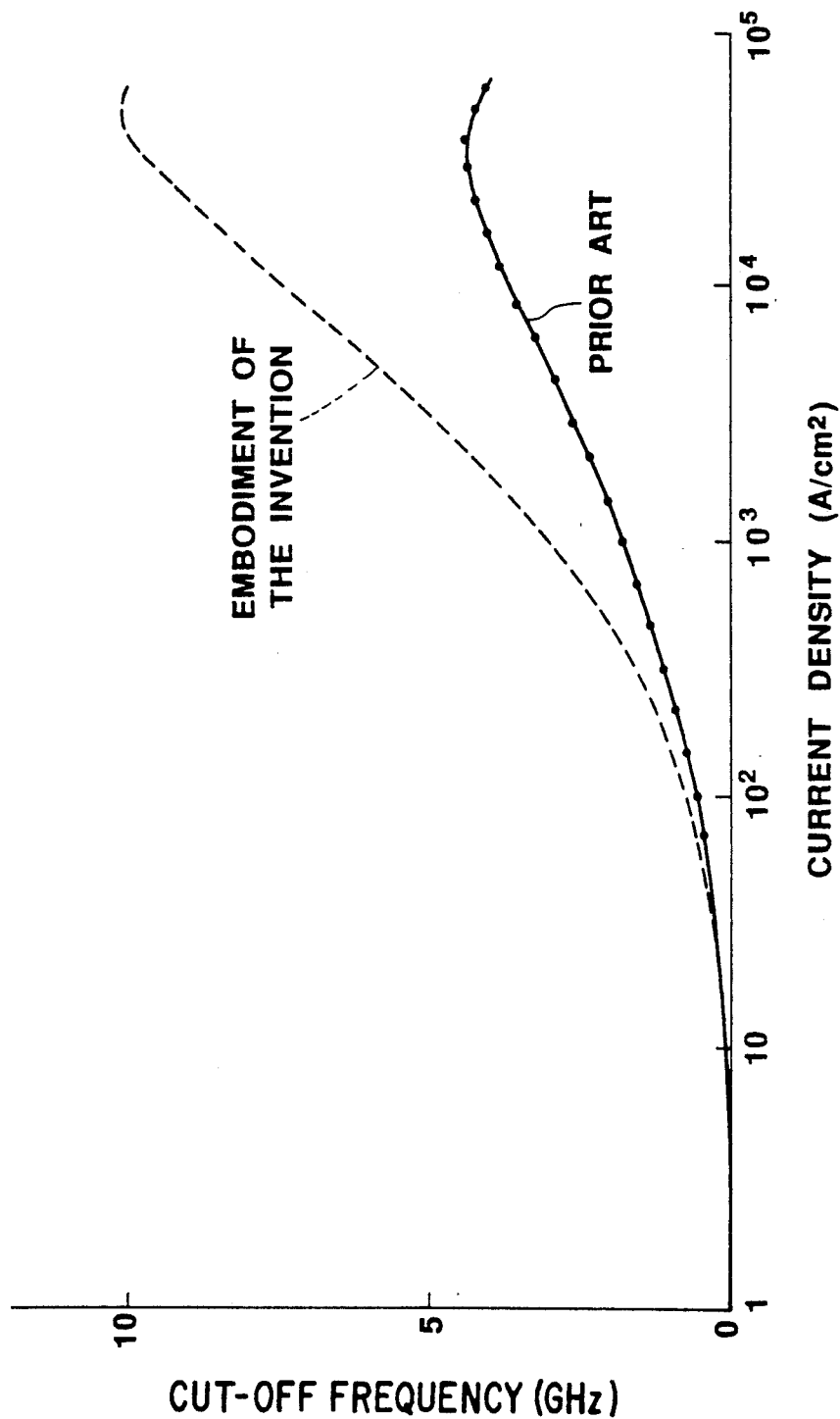
FIG. 5 is a graph showing relationships between cut-off frequency and current density obtained through simulation with respect to the HBT of the first embodiment of the present invention and the prior art HBT.

Shown in FIG. 5 is a graph showing relationships between cut-off frequency and current density obtained through simulation with respect to the HBT of the present embodiment having such impurity profiles as shown in FIG. 3 and the prior art HBT having such impurity profiles as shown in FIG. 14 for their comparison. It will be seen from the drawing that the HBT of the present embodiment exhibits a cut-off frequency higher than that of the prior art one in a current density zone higher than $10^2 A/cm^2$.

As a result, when the layer structure of the present invention is employed, there can be provided an HBT which is excellent not only in DC characteristics but also in high frequency characteristics.

Embodiment 2

Figure 6:
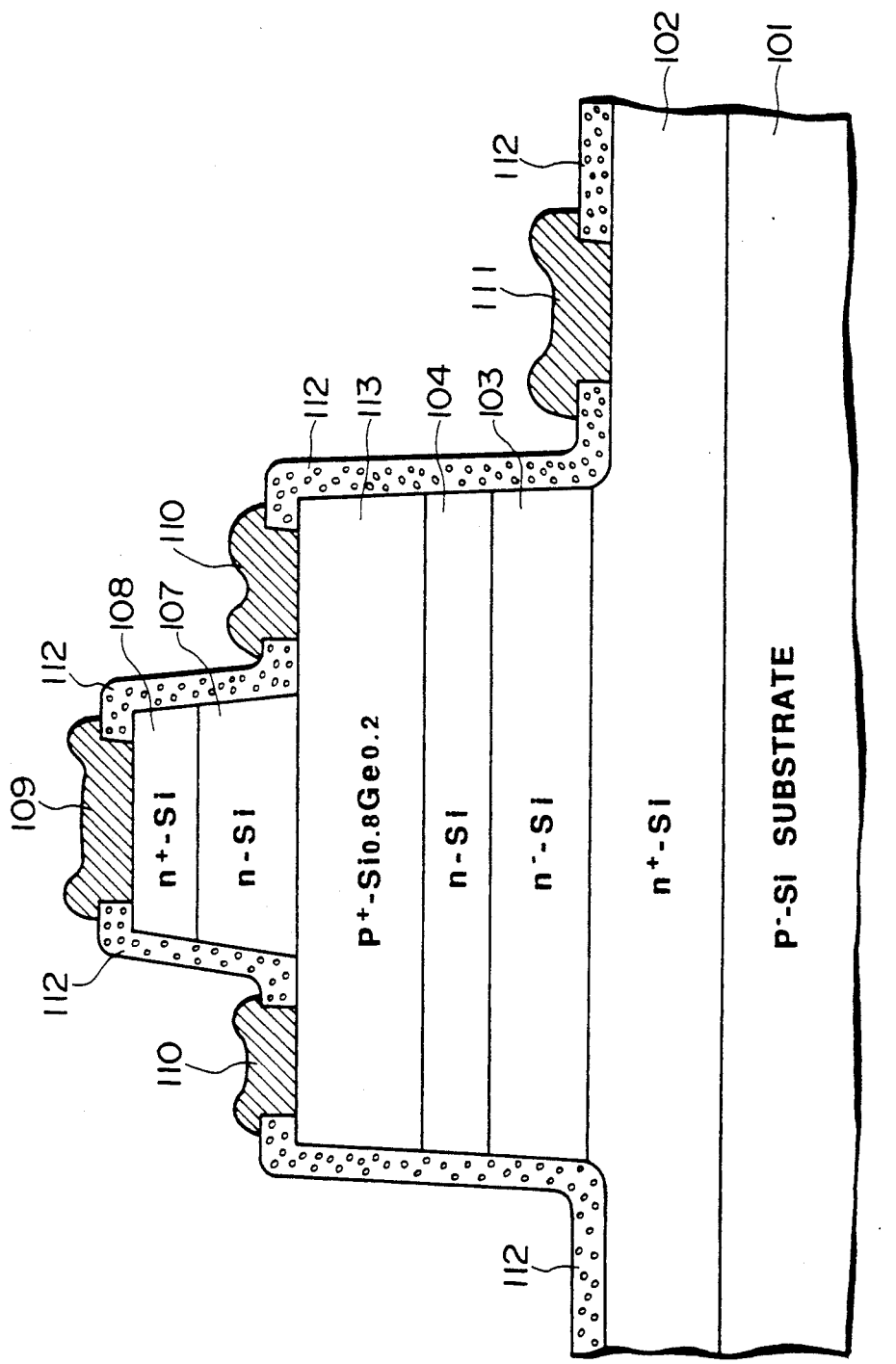
FIG. 6 is a cross-sectional view of an HBT in accordance with a second embodiment of the present invention.

FIG. 6 shows an HBT in accordance with a second embodiment of the present invention. In this case, the present embodiment is substantially the same as the first embodiment, except that the double base layers 105 and 106 in the first embodiment are replaced by a p− type $Si_{0.8}Ge_{0.2}$ single-layer 113.

Embodiment 3

Figure 7:
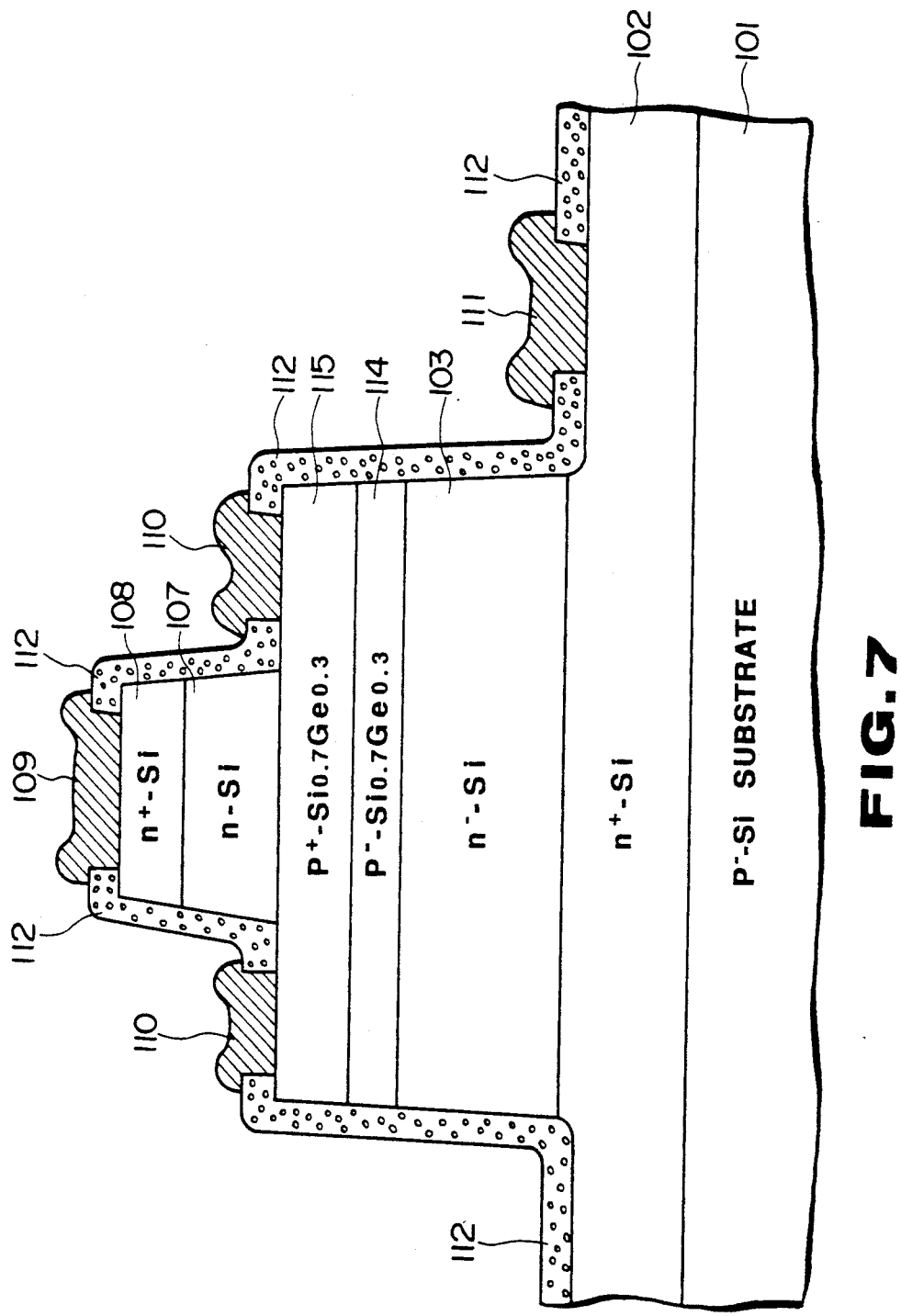
FIG. 7 is a cross-sectional view of an HBT in accordance with a third embodiment of the present invention.

FIG. 7 shows an HBT in accordance with a third embodiment of the present invention. In this case, the present embodiment is substantially the same as the first embodiment, except that a base is of a 2-layer structure comprising a p− type $Si_{0.7}Ge_{0.3}$ layer 115 and a p type $Si_{0.7}Ge_{0.3}$ layer 114 and a collector comprises an n− type Si single layer 103.

Embodiment 4

Figure 8:
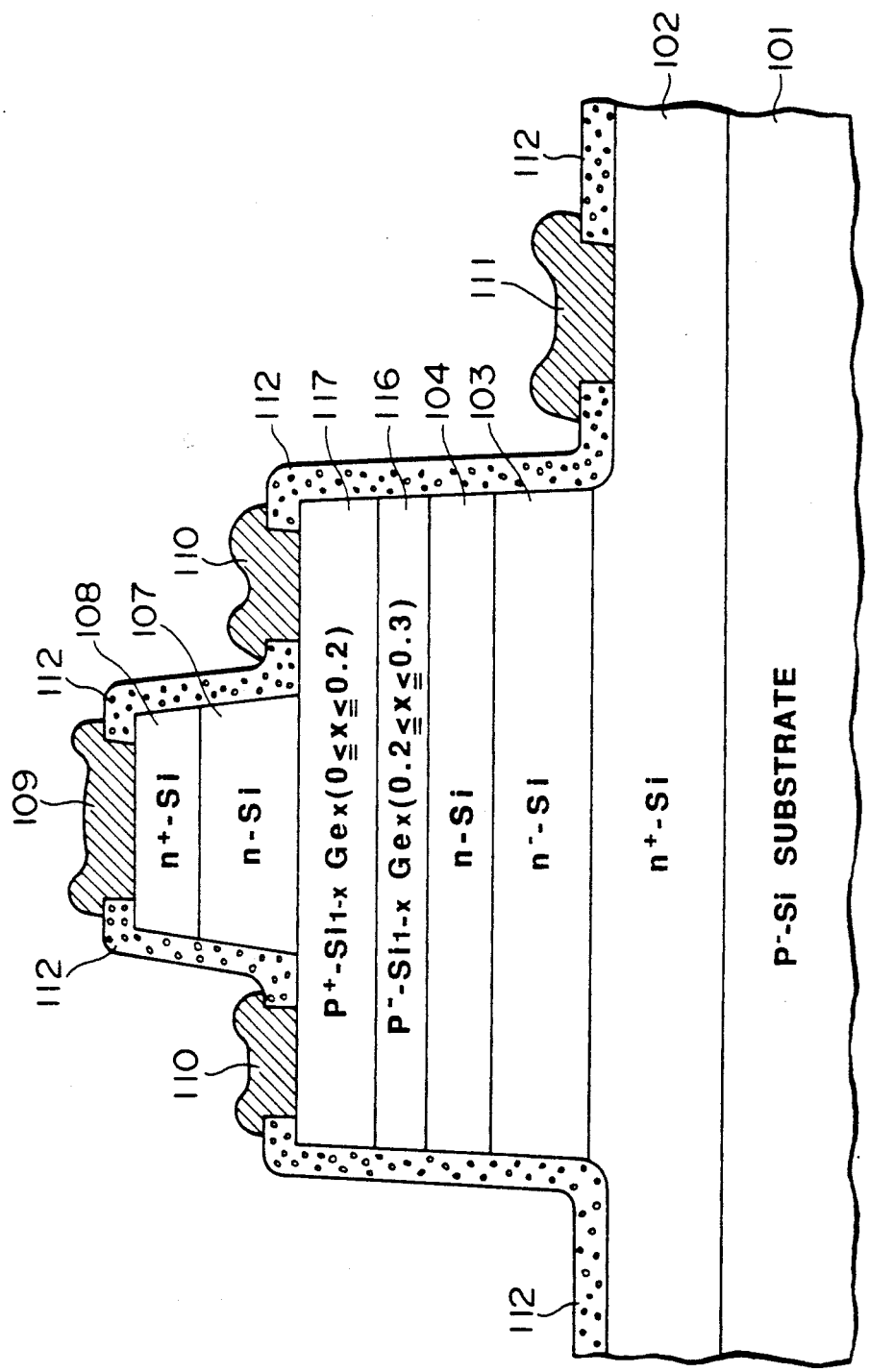
FIG. 8 is a cross-sectional view of an HBT in accordance with a fourth embodiment of the present invention.

FIG. 8 shows an HBT in accordance with a fourth embodiment of the present invention. In this case, the present embodiment is substantially the same as the first embodiment, except that the double base layers 105 and 106 in the first embodiment are replaced by a p− type $Si_{1-x}Ge_x$ layer ($0 \leq x \leq 0.2$) 117 and a p type $Si_{1-x}Ge_x$ layer ($0.2 \leq x \leq 0.3$) 116. In addition, the composition ratio x in the base is set so as to gradually increase from its base side to the collector side. In other words, an electric field for acceleration of electrons is provided so that electrons entered into the base from the emitter can quickly move to the collector side within the base.

Embodiment 5

Figure 9:
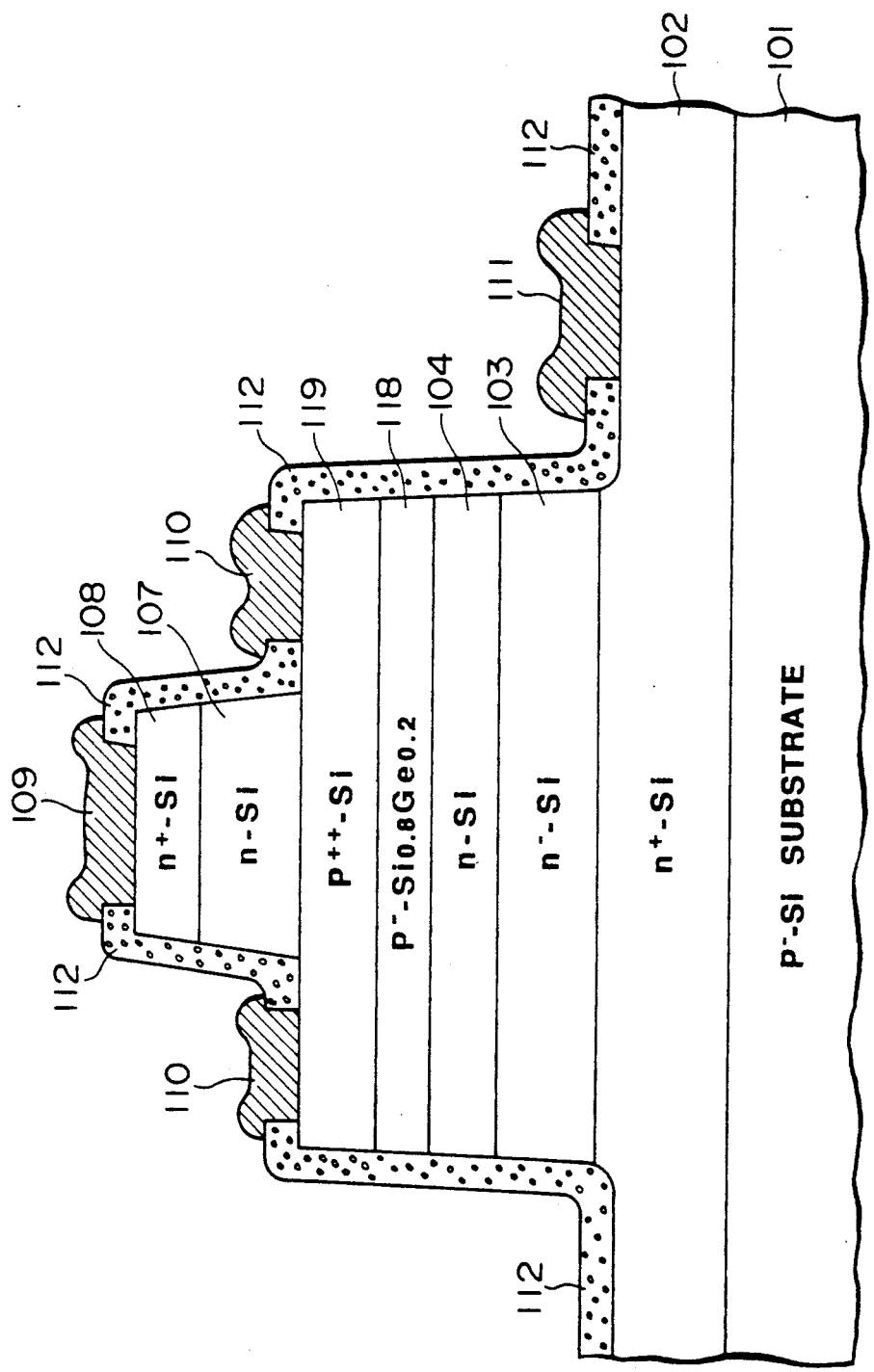
FIG. 9 is a cross-sectional view of an HBT in accordance with a fifth embodiment of the present invention.

FIG. 9 shows an HBT in accordance with a fifth embodiment of the present invention. In this case, the present embodiment is substantially the same as the first embodiment, except that a base is of a 2-layer structure comprising a p− − type Si layer 119 and and a p− type $Si_{0.8}Ge_{0.2}$ layer 118. However, since the p− − type Si layer 119 is set to have a very high doping concentration, the layer 119 is substantially equal in energy band gap to the $Si_{0.8}Ge_{0.2}$ layer 118 under the influence of the band gap reduction effect. Thus, since the entire base region has a substantially narrow gap when compared with the emitter or collector, the fifth embodiment resembles the first embodiment with regard to the band structure.

Although explanation has been made in connection with only the $Si_{1-x}Ge_x$/Si HBT in the foregoing embodiments, the same explanation can also hold true for an npn type transistor using InP/GaInAsP material wherein the band discontinuity of a heterojunction appears mainly on the side of a valence band and a pnp type transistor using AlGaAs/GaAs material wherein the band discontinuity of a heterojunction appears mainly on the side of a conduction band.

Embodiment 6

Explanation will next be made as to an npn type HBT using InP/GaInAsP material as a sixth embodiment of the present invention.

Figure 10:
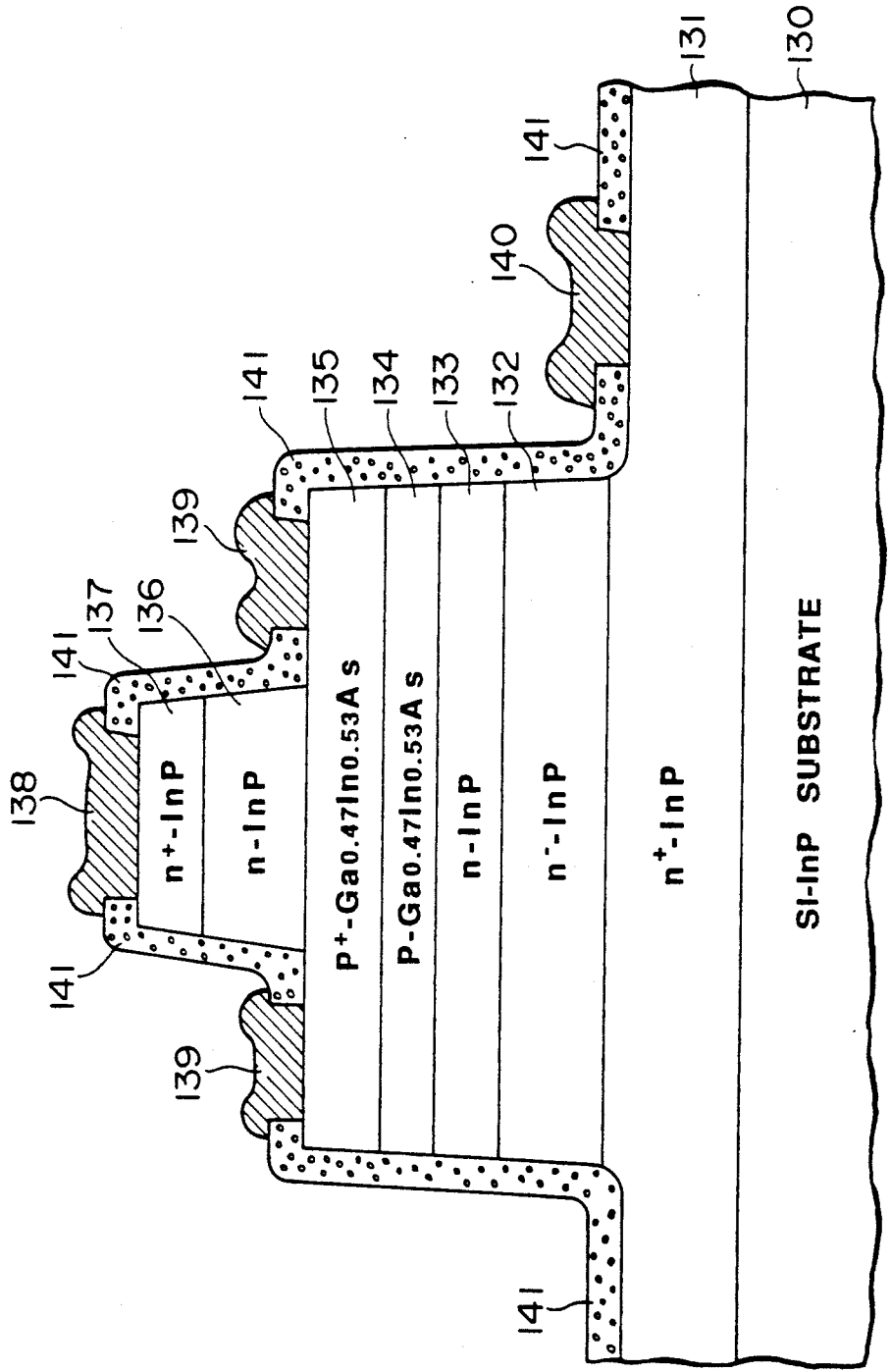
FIG. 10 is a cross-sectional view of an HBT in accordance with a sixth embodiment of the present invention.

Shown in FIG. 10 is a cross-sectional view of such an HBT.

The transistor having a double heterostructure comprises an n− type InP layer 131 as a collector contact layer, an n− InP layer 132 as a first collector layer, an n type InP layer 133 as a second collector layer, a p− type $Ga_{0.47}In_{0.53}As$ layer 134 as a first base layer, a p type $Ga_{0.47}In_{0.53}As$ layer 135 as a second base layer, an n type InP layer 136 as an emitter layer, and an n− type InP layer 137 as an emitter cap layer, these layers being all sequentially formed on a semi-insulating InP substrate 130, the semiconductor ratio of the base region being set so as to provide lattice matching to the semiconductor substrate.

In an InP/$Ga_{0.47}In_{0.53}As$ heterojunction, since the amount of band discontinuity on the side of a conduction band is about 0.06eV while the amount of band discontinuity on the side of a valence band is about 0.43eV, that is, since most of the difference in forbidden band width appears on the side of the valence band, electrons can smoothly flow from the emitter to the collector.

Though the base region has been made of $Ga_{0.47}In_{0.53}As$ in the present embodiment, the similar effect can be obtained, in place of the above material, by using $Ga_{1-x}In_xAs_{1-y}P_y$ whose composition ratio is selected to provide lattice matching to InP.

Explanation has been made in connection with only the npn type transistor in the foregoing embodiments, the present invention can be similarly applied even to a pnp type transistor.

Embodiment 7

A pnp type HBT using AlGaAs/GaAs series material will be explained as a seventh embodiment of the present invention.

Figure 11:
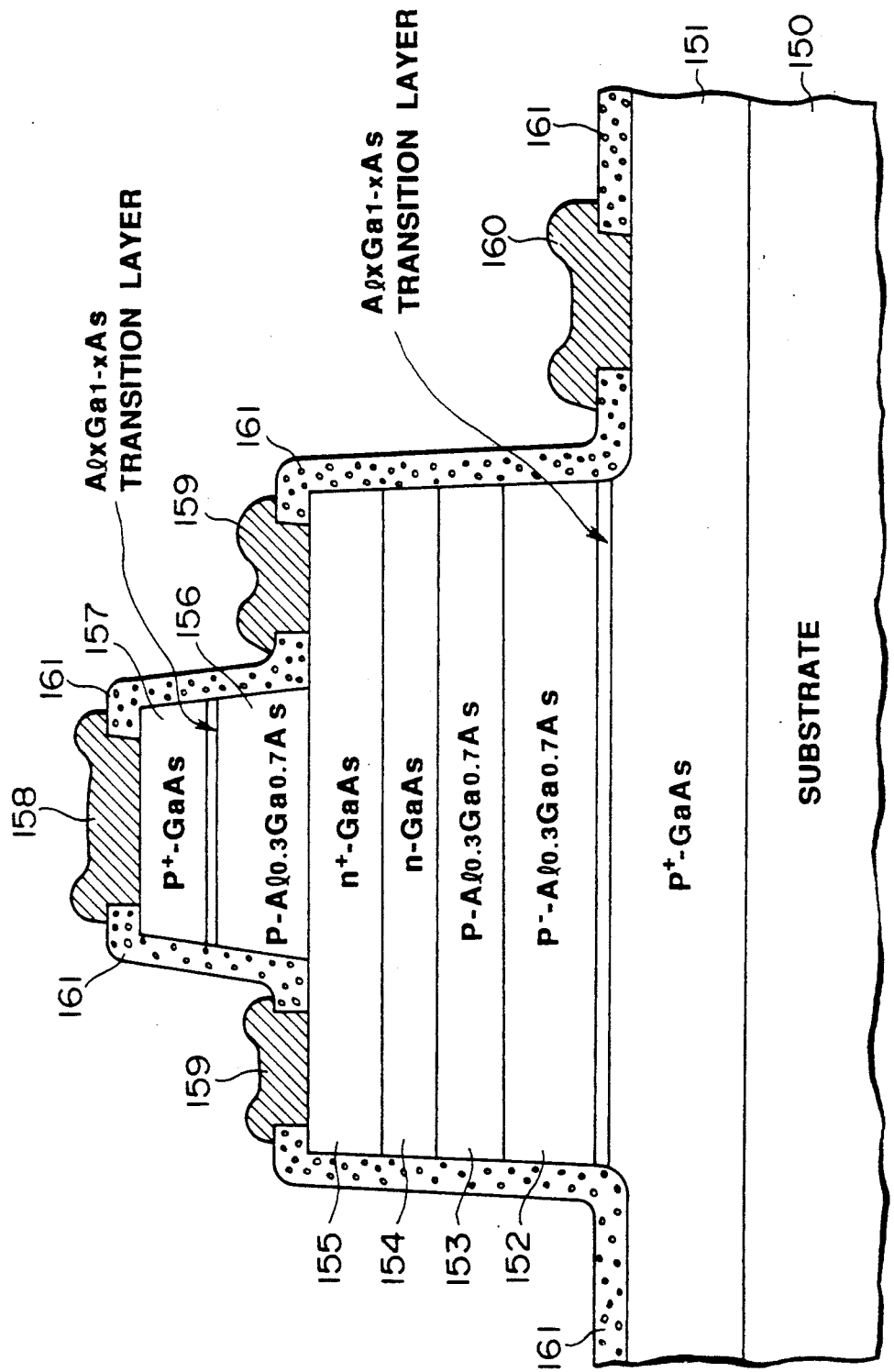
FIG. 11 is a cross-sectional view of an HBT in accordance with a seventh embodiment of the present invention.

Referring to FIG. 11, there is shown a cross-sectional view of the transistor which has a double heterostructure. More in detail, the transistor comprises a p− type GaAs layer 151 as a collector contact layer, a p type transistion layer $Al_yGa_{1-y}As$, a p− type $Al_{0.3}Ga_{0.7}As$ layer 152 as a first collector layer, a p type $Al_{0.3}Ga_{0.7}As$ layer 153 as a second collector layer, an n− type GaAs layer 154 as a first base layer, an n− type GaAs layer 155 as a second base layer, a p type transistion layer $Al_yGa_{1-y}As$, a p type $Al_{0.3}Ga_{0.7}As$ layer 156 as an emitter layer, and a p− type GaAs layer 157 as an emitter cap layer, these layers being all sequentially formed on a semi-insulating GaAs substrate 150, the semiconductor ratio of the base region being set so as to provide lattice matching to the semiconductor substrate.

In an $Al_{0.3}Ga_{0.7}As$/GaAs heterojunction, since the amount of band discontinuity on the side of a valence band is about 0.14eV while the amount of band discontinuity on the side of a conduction band is about 0.24eV, that is, since most of the difference in forbidden band width appears on the side of the conduction band, holes can smoothly flow from the emitter to the collector.

Though the collector region has been made of $Al_{0.3}Ga_{0.7}As$ in the present embodiment, the similar effect can be obtained, in place of the above material, by using $Al_yGa_{1-y}As$ having an arbitrary composition ratio x.

The present invention may be modified and carried out in various ways within the spirit and scope of the invention as defined by the appended claims.

Embodiment 8

Figure 12:
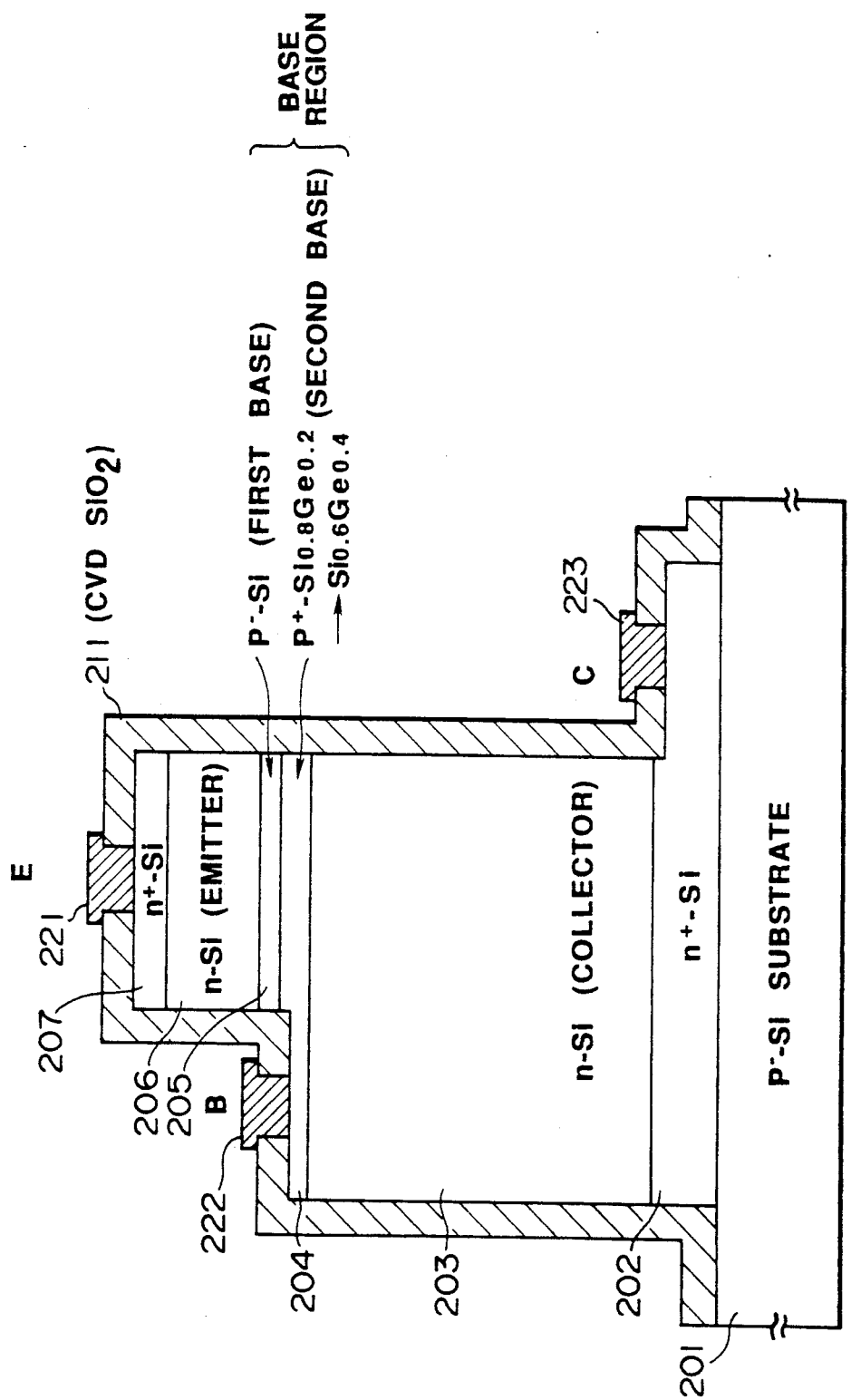
FIG. 12 is a cross-sectional view of an HBT in accordance with an eight embodiment of the present invention.

FIG. 12 is a cross-sectional view of an npn type HBT using Si/$Si_{1-x}Ge_x$/Si material.

The HBT is featured by comprising a first base layer of a low concentration which has the same band gap as an emitter region and is changed to a complete depletion layer in a thermally balanced state and a second base layer of a high concentration to which grading is applied.

More specifically, the HBT comprises an n+ type Si layer 202 having an impurity concentration of $1 \times 10^{20}$ cm$^{-3}$ and a thickness of 100 nm as a collector contact layer, an n type Si layer 203 having an impurity concentration of $2 \times 10^{17}$ cm$^{-3}$ and a thickness of 550 nm as a collector layer, a p− type $Si_{1-x}Ge_x$ layer 204 ($0.2 \leq x \leq 0.4$) having an impurity concentration of from $1 \times 10^{19}$ cm$^{-3}$ to $1 \times 10^{21}$ cm$^{-3}$, e.g., $2 \times 10^{19}$ cm$^{-3}$ and a thickness of from 30 to 80 nm, e.g., 50 nm as a second base layer, a p− type Si layer 205 having an impurity concentration of from $8 \times 10^{14}$ cm$^{-3}$ to $1 \times 10^{16}$ cm$^{-3}$, e.g., $1 \times 10^{15}$ cm$^{-3}$ and a thickness of from 10 to 50 nm. e.g., 30 nm as a first base layer, an n type Si layer 206 having an impurity concentration of $1 \times 10^{18}$ cm$^{-3}$ and a thickness of 150 nm as an emitter layer, an n$^-$ type Si layer 207 having an impurity concentration of $1 \times 10^{20}$ cm$^{-3}$ and a thickness of 50 nm as an emitter cap layer. these layers being sequentially epitaxially grown as laminated on a p$^-$ type Si substrate 201. In addition. an emitter electrode 221, a base electrode 222 and a collector electrode 223 are formed as contacted with the corresponding layers. Reference numeral 211 denotes a silicon oxide film.

Figure 13:
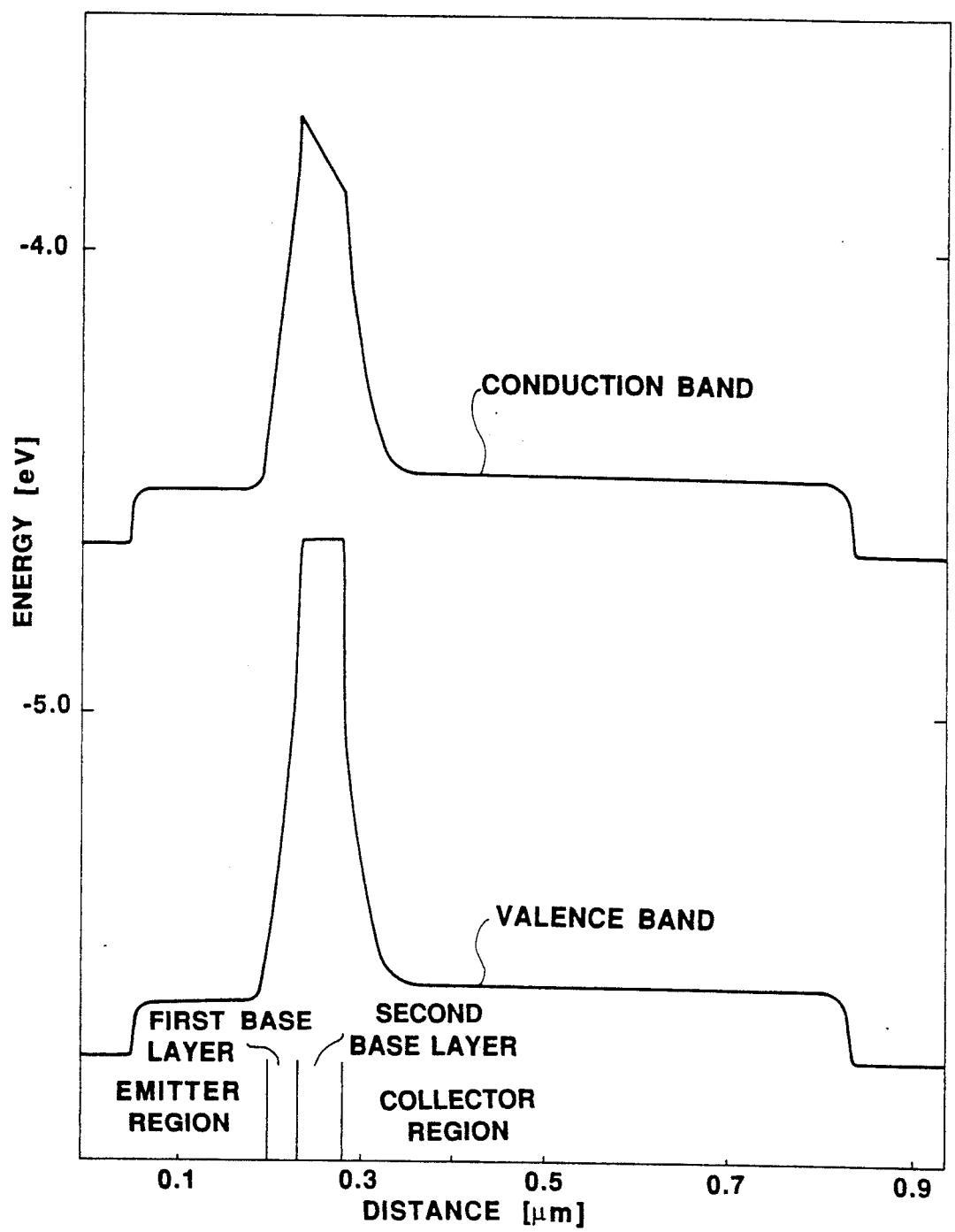
FIG. 13 shows band profiles of the transistor.

Shown in FIG. 13 is a band structure for the HBT. As will be noted from the band structure, a built-in potential $V_{b1}$ at a p-n junction between the emitter region and the first base layer is 0.79V.

By substituting for the relationship (1) the value 0.79V of $V_{b1}$, the values $1 \times 10^{15}$ cm$^{-3}$ and 30 nm of the impurity concentration and thickness of the first base layer, the value 11.9 of Si relative dielectric constant, it will be seen that the relationship satisfies its inequality.

For comparison, FIG. 14 shows a band structure for a prior art HBT having a base region of a single graded structure having an impurity concentration of $2 \times 10^{19}$ cm$^{-3}$ and an emitter region having an impurity concentration of $2 \times 10^{17}$ cm$^{-3}$.

Figure 15:
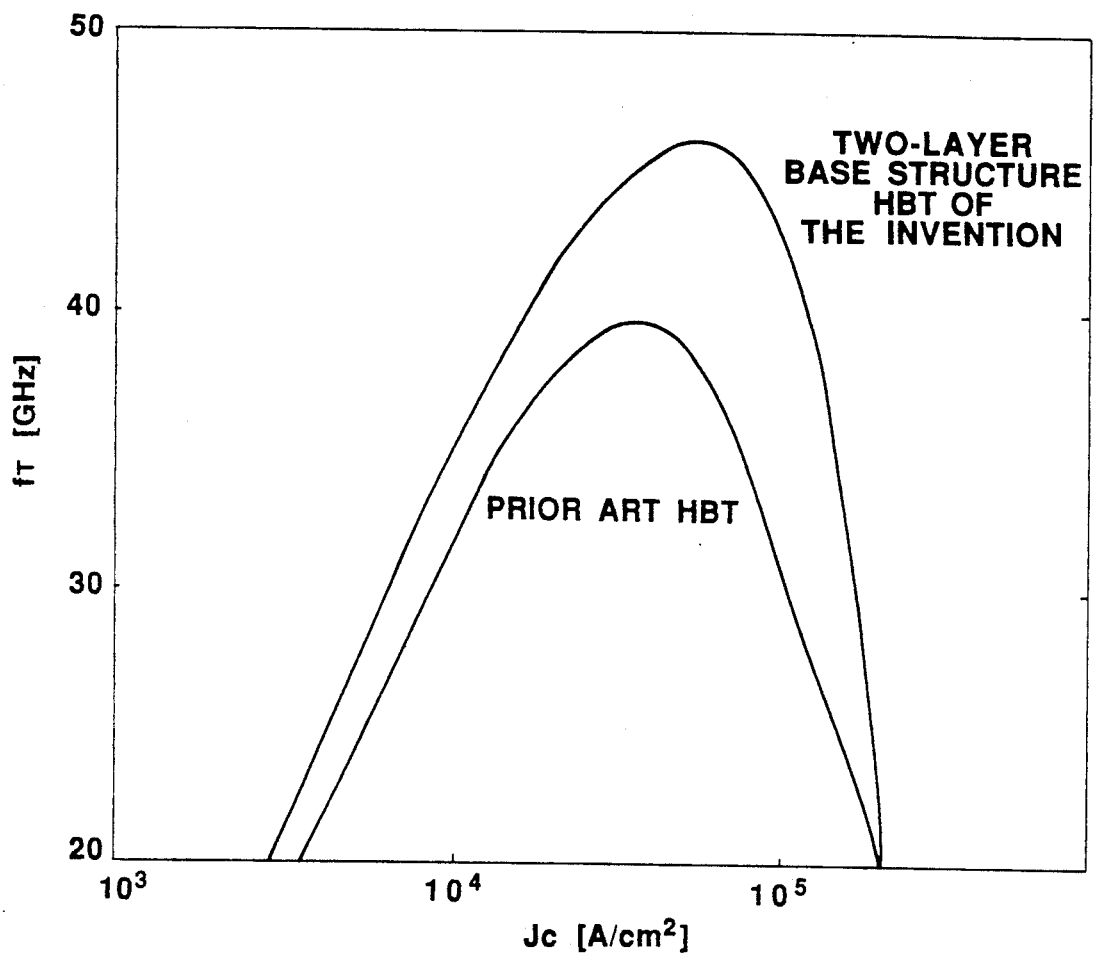
FIG. 15 is a graph showing relationships between cut-off frequency and collector current density with respect to the HBT of the present invention and the prior art HBT.

FIG. 15 is a graph showing numeral results of relationships between cut-off frequency and collector current obtained through numeral computation with respect to a transistor of substantially the same structure as the HBT fabricated according to the foregoing embodiment and a transistor of the above prior art structure.

It will be appreciated from the computation results that, in the event where the npn type HBT is employed in which a base region is of the 2-layer structure of the present invention comprising a first base layer provided closer to the emitter side to have a thickness and an impurity concentration set much lower than the emitter concentration set much lower than the emitter concentration so as to be changed to a complete depletion region in a thermally balanced state at an emitter-collector voltage of 1.5V as well as a second base layer of a high impurity concentration provided closer to the collector side and subjected to a grading, its cut-off frequency is increased from 39.9 GHz (in the case of the prior art structure) to 46.3 GHz (in the case of the new structure of the present invention) by 16.0%.

As a result, a carrier transit time of the new structure of HBT necessary for completely passing through the element is 3.43 psec. that is shortened by 0.56 psec. compared with 3.43 psec. in the prior art structure of HBT. In this case, the maximum of electric field at the p-n junction between the emitter and base is $1.93 \times 10^5$V/cm in the new structure and $2.00 \times 10^5$V/cm in the prior art structure. That is, it will be appreciated that no deterioration in the voltage withstanding characteristic takes place between the emitter and base.

In the foregoing embodiment, the npn type HBT using the Si/Si$_{1-x}$Ge$_x$/Si material has been explained. However, the present invention is not limited to the particular example. For example, even when GaAs/AlGaAs, AlInAs/GaInAs, or InP/GaInAs material may be employed for npn and pnp type HBTs, substantially the same effect can be obtained. Further, the impurity concentrations and thickness of the respective semiconductor layers may be modified as necessary.

In addition, the present invention may be modified and carried out in various ways within the spirit and scope of the invention as defined by the appended claims.

Embodiment 9

Figure 16:
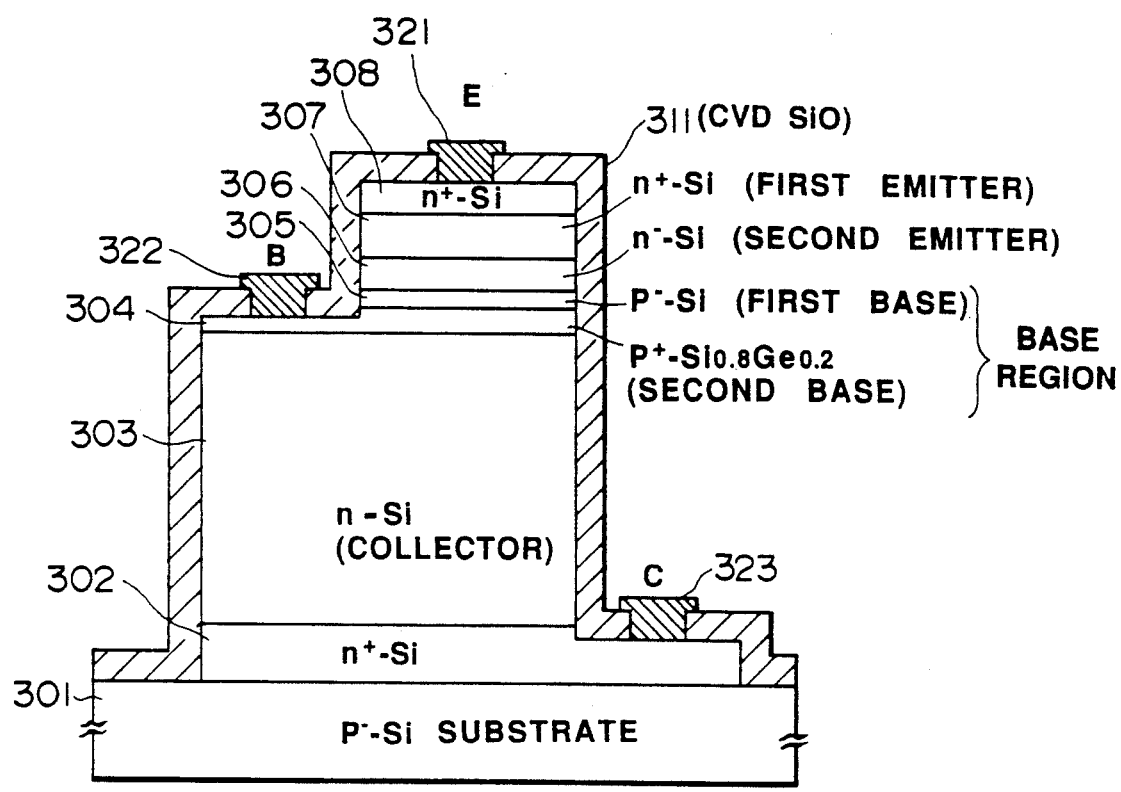
FIG. 16 is a cross-sectional view of an HBT in accordance with a ninth embodiment of the present invention.

Shown in FIG. 16 is a cross-sectional view of an npn type HBT using the Si/Si$_{1-x}$Ge$_x$/Si material as a ninth embodiment of the present invention.

The HBT is featured by an emitter region which comprises a first emitter layer and a second emitter layer made of the same material as the first emitter layer and lower in concentration therethan and by a base region which comprises a first base layer of a low concentration made of the same material as the emitter region and changed to a complete depletion layer in a thermally balanced state and a second base layer narrower in energy band gap than the first base layer.

More in detail, the HBT comprises an n$^-$ type Si layer 302 having an impurity concentration of $1 \times 10^{20}$ cm$^{-3}$ and a thickness of 100 nm as a collector contact layer, an n type Si layer 303 having an impurity concentration of $2 \times 10^{17}$ cm$^{-3}$ and a thickness of 480 nm as a collector layer, a p$^-$ type Si$_{0.8}$Ge$_{0.2}$ layer 304 having an impurity concentration of $2 \times 10^{19}$ cm$^{-3}$ and a thickness of 50 nm as a second base layer, a p$^-$ type Si layer 305 having an impurity concentration of $1 \times 10^{15}$ cm$^{-3}$ and a thickness of 50 nm as a first base layer, an n-type Si layer 306 having an impurity concentration of $1 \times 10^{18}$ cm$^{-3}$ and a thickness of 20 nm as a second emitter layer, an n type Si layer 307 having an impurity concentration of $2 \times 10^{17}$ cm$^{-3}$ and a thickness of 150 nm as a first emitter layer, an n$^-$ type Si layer 308 having an impurity concentration of $1 \times 10^{20}$ cm$^{-3}$ and a thickness of 50 nm as an emitter cap layer. these layers being sequentially epitaxially grown as laminated on a p$^-$ type Si substrate 301. In addition, an emitter electrode 321, a base electrode 322 and a collector electrode 323 are formed as contacted with the corresponding layers. Reference numeral 311 denotes a silicon oxide film.

Figure 17:
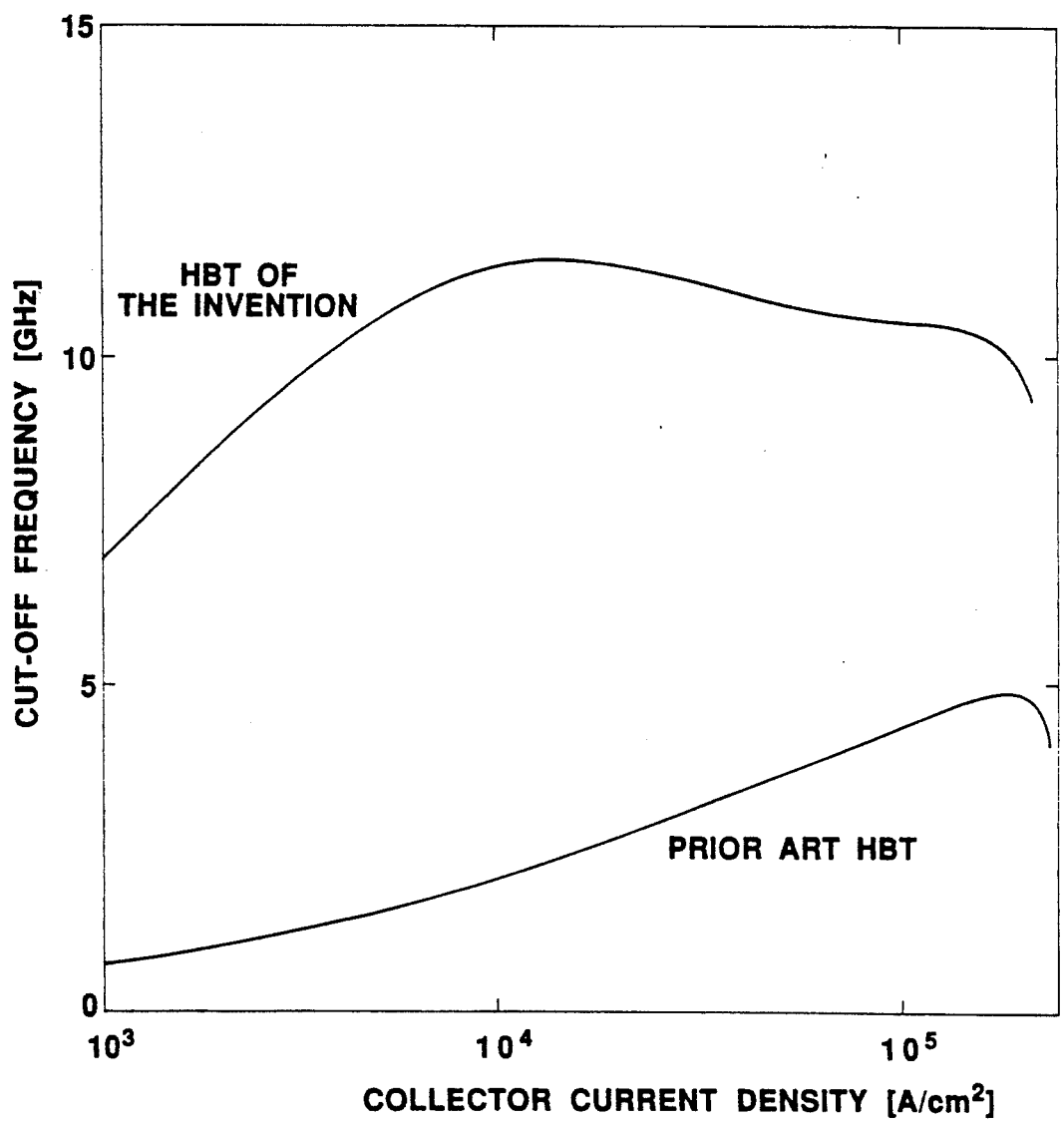
FIG. 17 is a graph showing relationships between cut-off frequency and collector current density with respect to the HBT of the embodiment and the prior art HBT.
Figure 18:
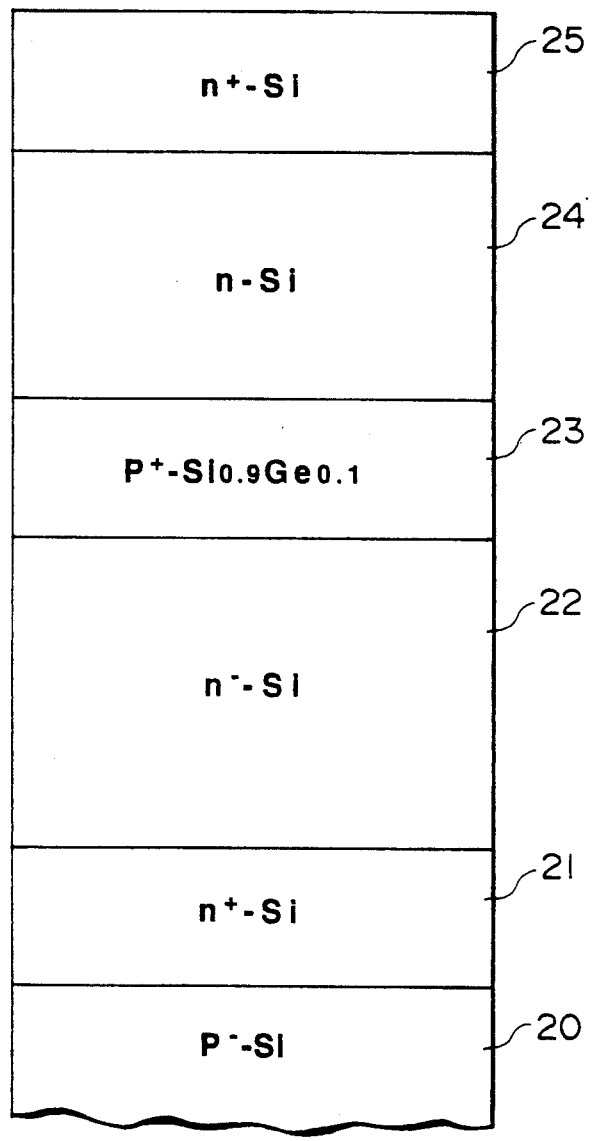
FIG. 18 is a cross-sectional view of epitaxial layers of a prior art HBT.
Figure 19:
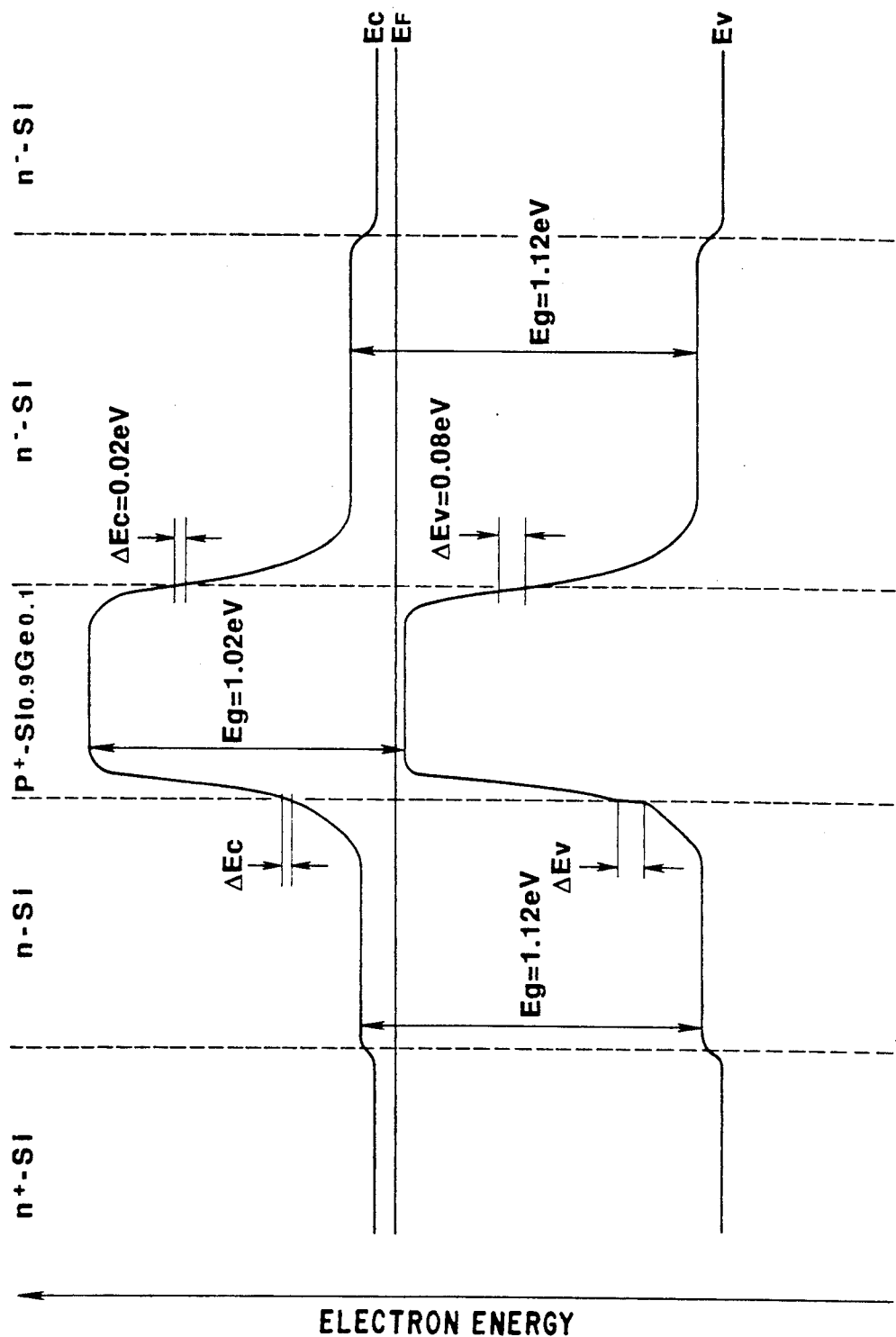
FIG. 19 shows energy band profiles of a prior art HBT of a film structure when an impurity profile according to design values was attained.
Figure 20:
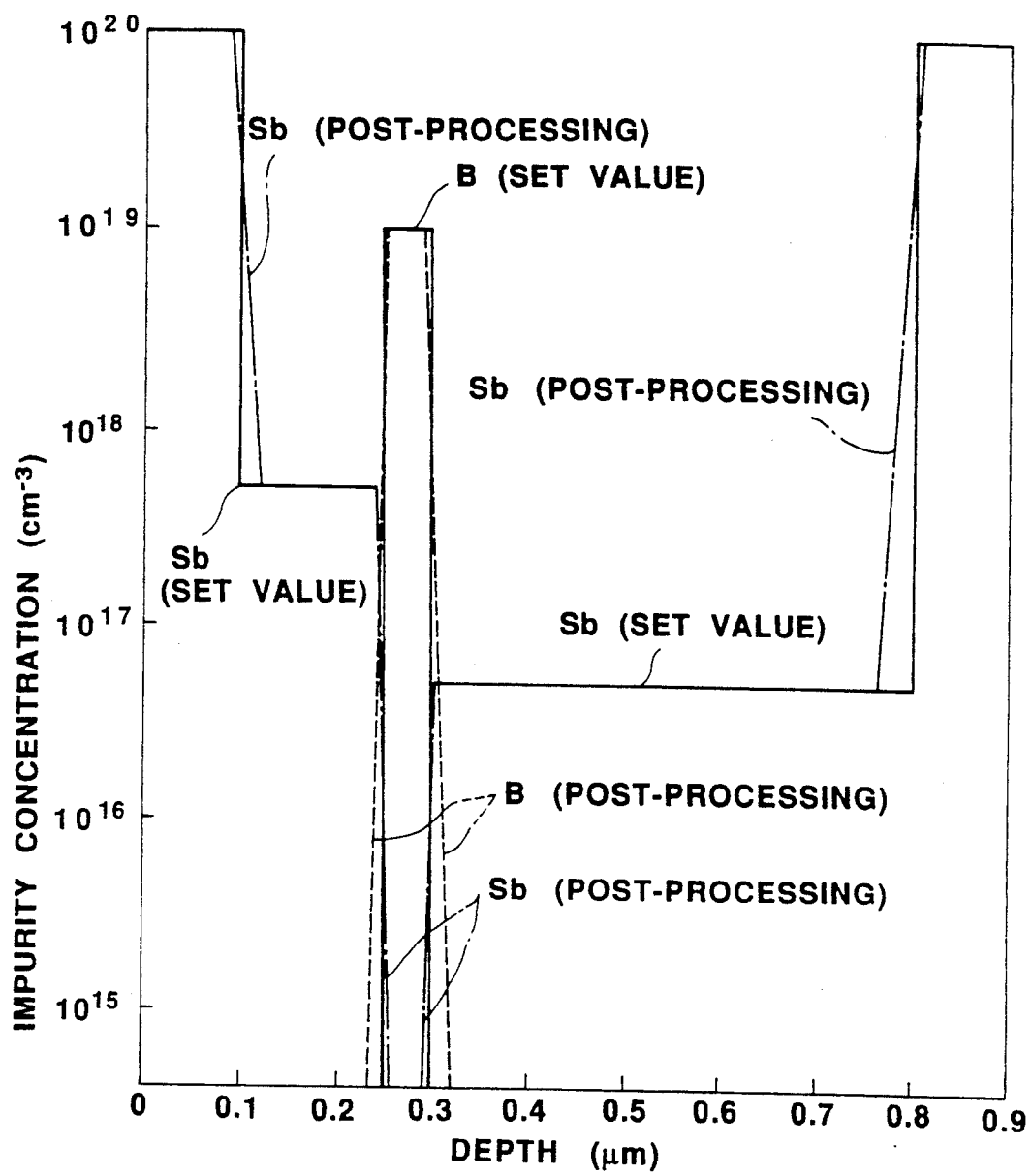
FIG. 20 shows a design impurity profile of the prior art HBT and an impurity profile after subjected processes.
Figure 21:
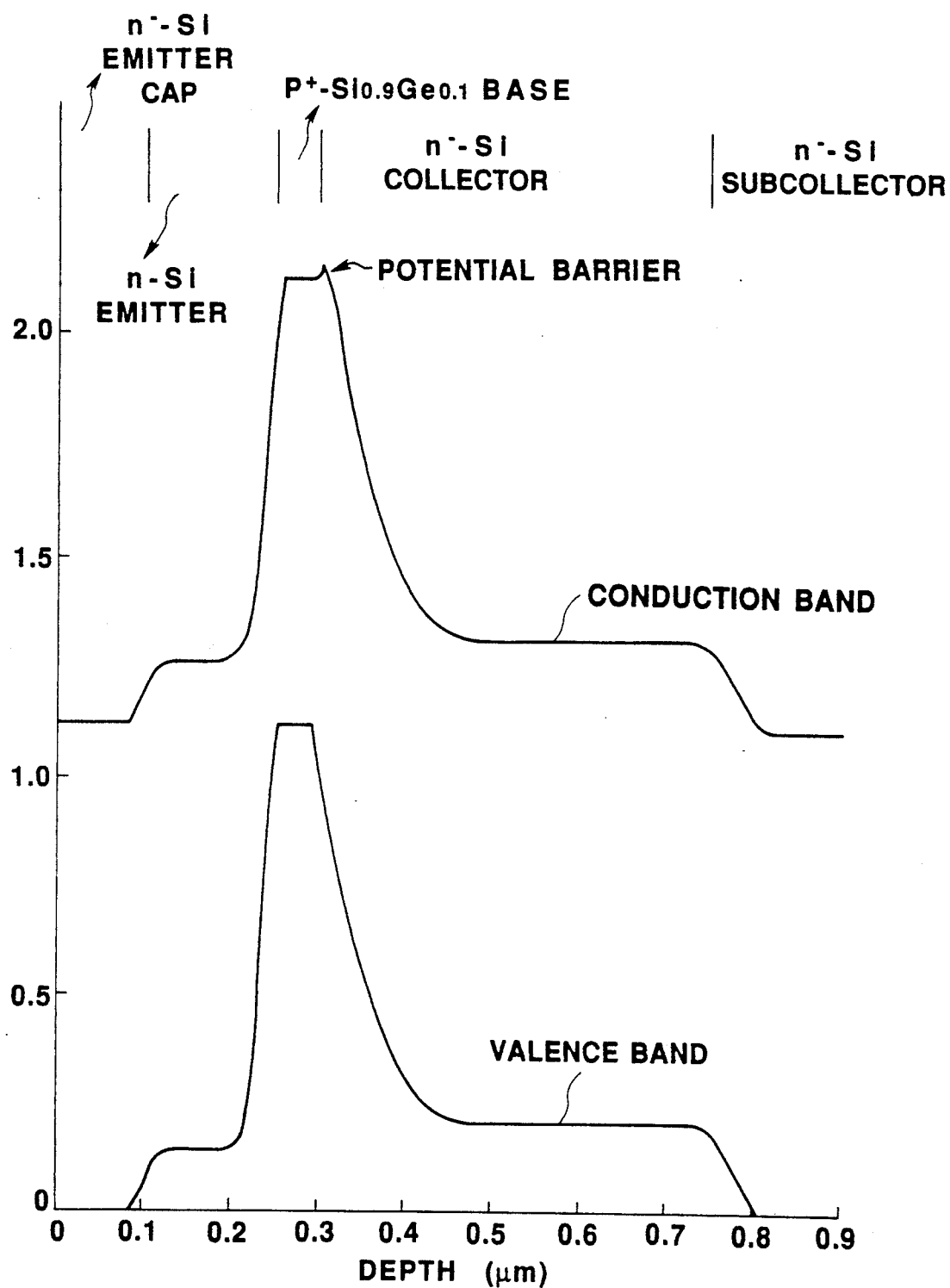
FIG. 21 shows energy band profiles of the prior art HBT in a thermally balanced state obtained through simulation.

FIG. 17 is a graph showing numeral results of relationships between cut-off frequency and collector current obtained through numeral computation with respect to an HBT fabricated according to the foregoing embodiment and a transistor of exactly the same prior art structure as the HBT fabricated according to the foregoing embodiment except that the first base layer is made of the p$^-$ type Si$_{0.8}$Ge$_{0.2}$ material.

It will be appreciated from the computation results that, in the event where the npn type HBT of the 2-layer base/emitter structure according to the present invention is employed at an emitter-collector voltage of 1.5V, its cut-off frequency is 2.3 times increased from 4.9GHz (in the case of the prior art structure) to 11.5GHz (in the case of the new structure of the present invention).

Though the second base layer comprises the p$^-$ type Si$_{0.8}$Ge$_{0.2}$ layer having an impurity concentration of $2 \times 10^{19}$ cm$^{-3}$ and a thickness of 50 nm in the foregoing embodiment, the second base layer may have such a graded structure that the composition ratio of the compound semiconductor material is varied so as to become narrower continuously or stepwise from its first base layer side to the collector side. As a result, its carrier transit time through the base for acceleration of an electric field is further shortened. In addition, since the impurity concentration of the first base layer is set to be lower than that of the second one, there exists substantially no region where the changing of the first base layer to the complete depletion layer region causes the grading effect to be lost.

In the foregoing embodiment, the npn type HBT using the Si/Si$_{1-x}$Ge$_x$/Si material has been explained. However, the present invention is not limited to the particular example. For example, even when GaAs/AlGaAs, AlInAs/GaInAs, or InP/GaInAs material may be employed for npn and pnp type HBTs, substantially the same effect can be obtained. Further, the impurity concentrations and thickness of the respective semiconductor layers may be modified as necessary.

In addition, the present invention may be modified and carried out in various ways within the spirit and scope of the invention as defined by the appended claims.

What is claimed is:

1. A heterojunction bipolar transistor of a double heterojunction structure comprising at least 5 layers including of a first semiconductor layer of a first electric conductivity type, a second semiconductor layer of a second electric conductivity type, a third semiconductor layer of the second conductivity type, a fourth semiconductor layer of the first conductivity type and fifth semiconductor layer of the first conductivity type, said first to fifth layers being sequentially formed as laminated, wherein forbidden band widths of said first, fourth and fifth semiconductor layers are set larger than forbidden band widths of said second and third semiconductor layers, a heterojunction between the third and fourth semiconductor layers is formed so that the forbidden band widths abruptly vary within a range of several atomic layers, the first semiconductor layer functions as an emitter, the second and third semiconductor layers function as a base, and the fourth and fifth semiconductor layers function as a collector, said transistor satisfying relationships which follow:

$$W_2 = W_3 \text{ and } N_2 = N_3 \text{ and } N_4 > N_5$$

or $$W_2 = W_3 \text{ and } N_2 > N_3 \text{ and } N_4 = N_5$$

where, said second semiconductor layer has an impurity doping concentration $N_2$ and a thickness $W_2$, said third semiconductor layer has an impurity doping concentration $N_3$ and a thickness $W_3$, said fourth semiconductor layer has an impurity doping concentration $N_4$ and a thickness $W_4$, and said fifth semiconductor layer has an impurity doping concentration $N_5$.

2. A heterojunction bipolar transistor as set forth in claim 1, wherein a relationship between said third and fourth semiconductor layers which follows is satisfied:

$$W_4 \leq \left[ \frac{2\epsilon_4 V_{bi}}{q N_4 (1 - \epsilon_3 N_4/(\epsilon_4 N_3))} \right]^{\frac{1}{2}}$$

where, said third semiconductor layer has the impurity doping concentration $N_3$ and a dielectric constant $\epsilon_3$, said fourth semiconductor layer has the impurity doping concentration $N_4$, a dielectric constant $\epsilon_4$ and the thickness $W_4$, and a built-in voltage between said third and fourth semiconductor layers is $V_{bi}$.

3. A heterojunction bipolar transistor as set forth in claim 1, wherein said first, fourth and fifth semiconductor layers are made of Si and said second and third semiconductor layers are made of Si$_{1-x}$Ge$_x$ ($0.0 < x \leq 1.0$).

4. A heterojunction bipolar transistor as set forth in claim 1, wherein said first, fourth and fifth semiconductor layers are made of Si and said second and third semiconductor layers respectively comprise a single layer structure made of Si$_{1-x}$Ge$_x$ ($0.0 < x \leq 1.0$).

5. A heterojunction bipolar transistor as set forth in claim 1, wherein said first semiconductor layer is made of Si, said fourth and fifth semiconductor layers respectively comprise a single layer structure made of Si, said second and third semiconductor layers are made of Si$_{1-x}$Ge$_x$ ($0.0 < x \leq 1.0$) set to have an identical composition ratio, and said second semiconductor layer has a higher impurity doping concentration than said third semiconductor layer.

6. A heterojunction bipolar transistor as set forth in claim 1, wherein said first semiconductor layer is made of Si, said fourth and fifth semiconductor layers are made of Si set to have an identical composition ratio, said fourth semiconductor layer has a higher impurity doping concentration than said fifth semiconductor layer, and said second and third semiconductor layers are respectively made of Si$_{1-x}$Ge$_x$ ($0.0 < x \leq 1.0$) in a graded structure.

7. A heterojunction bipolar transistor as set forth in claim 1, wherein said first, fourth and fifth semiconductor layers are made of InP, said second and third semiconductor layers are made of GaInAs, said second semiconductor layer has a higher impurity doping concentration than said third semiconductor layer, and said fourth semiconductor layer has a higher impurity doping concentration than said fifth semiconductor layer.

8. A heterojunction bipolar transistor as set forth in claim 1, wherein said first, fourth and fifth semiconductor layers are made of AlGaAs, said second and third semiconductor layers are made of GaAs, said second semiconductor layer has a higher impurity doping concentration than said third semiconductor layer, and said fourth semiconductor layer has a higher impurity doping concentration than said fifth semiconductor layer.

9. A heterojunction bipolar transistor comprising an emitter region having a first electric conductivity type, a base region having a second electric conductivity type opposite to said first conductivity type, and a collector region having the first conductivity type, wherein at least part of said base region is made of a material smaller in energy band gap than said emitter region, said base region comprising:

a first base layer positioned on a side of said emitter region and set equal in energy band gap to the emitter region and lower in impurity concentration than the emitter region, a thickness and an impurity concentration of said first base layer being set to be changed to a complete depletion layer region in a thermally balanced state; and a second base layer positioned on a side of said collector region to form a heterojunction together with said first base layer, said second base layer being made of a compound semiconductor material set higher in impurity concentration than said first base layer, a composition ratio of said compound semiconductor material being varied so that an energy band gap becomes narrower continuously or stepwise from its first base layer side to the collector region.

10. A heterojunction bipolar transistor as set forth in claim 9, wherein said first base layer is made of a material having the same composition ratio as the semiconductor material of said emitter region.

11. A heterojunction bipolar transistor as set forth in claim 9, wherein an entire energy band gap of said second base layer is smaller than energy band gaps of said emitter region and said first base layer.

12. A heterojunction bipolar transistor as set forth in claim 9, wherein said emitter region and said first base layer are made of Si, and said second base layer is made of $Si_{1-x}Ge_x$ ($0 < x \leq 1$).

13. A heterojunction bipolar transistor as set forth in claim 9, wherein said emitter region and said first base layer are made of AlGaAs, and said second base layer is made of GaAs.

14. A heterojunction bipolar transistor as set forth in claim 9, wherein said emitter region and said first base layer are made of AlInAs, and said second base layer is made of GaInAs.

15. A heterojunction bipolar transistor as set forth in claim 9, wherein said emitter region and said first base layer are made of InP, and said second base layer is made of GaInAs.

16. A heterojunction bipolar transistor comprising an emitter region having a first electric conductivity type, a base region having a second electric conductivity type opposite to said first conductivity type, and a collector region having the first conductivity type, wherein at least part of said base region is made of a material smaller in energy band gap than said emitter region, said emitter region comprising:
a first emitter layer having the first conductivity type; and
a second emitter layer made of the same material as said first emitter layer, said second emitter layer having a lower impurity doping concentration than said first emitter layer, said base region comprising:
a first base layer having the second conductivity type opposite to said first conductivity type and made of a material set equal in energy band gap to said first and second emitter layers; and
a second base layer made of a material set smaller in energy band gap than said first base layer.

17. A heterojunction bipolar transistor as set forth in claim 16, wherein said first and second emitter layers, said collector region and said first base layer are made of Si, and said second base layer is made of $Si_{1-x}Ge_x$ ($0.0 < x \leq 1.0$).

* * * * *